(12) United States Patent
Saito et al.

(10) Patent No.: US 6,361,857 B1
(45) Date of Patent: Mar. 26, 2002

(54) HEATSINK AND FABRICATION METHOD THEREOF

(75) Inventors: Hirohisa Saito; Yoshiyuki Yamamoto; Kiichi Meguro; Takahiro Imai, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/232,011

(22) Filed: Jan. 14, 1999

(30) Foreign Application Priority Data

| Jan. 16, 1998 | (JP) | 10-006238 |
| Jul. 31, 1998 | (JP) | 10-216683 |
| Jul. 31, 1998 | (JP) | 10-230187 |
| Dec. 22, 1998 | (JP) | 10-376395 |

(51) Int. Cl.⁷ .............................................. B32B 9/00
(52) U.S. Cl. ............... 428/319.1; 427/532; 427/577; 428/212; 428/216; 428/332; 428/408; 428/457; 428/310.5; 428/312.2; 428/318.6; 257/77
(58) Field of Search ............................. 428/408, 457, 428/216, 332, 212, 310.5, 312.2, 318.4, 319.1; 427/577, 532; 257/77

(56) References Cited

U.S. PATENT DOCUMENTS

| 4,680,618 A | * | 7/1987 | Kuroda et al. ............... 357/74 |
| 5,086,333 A | * | 2/1992 | Osada et al. .................. 357/67 |
| 5,324,987 A | | 6/1994 | Iacovangelo et al. |
| 5,413,751 A | * | 5/1995 | Polese et al. ................ 75/245 |
| 5,525,428 A | * | 6/1996 | Osada et al. ............... 428/546 |
| 5,886,407 A | * | 3/1999 | Polese et al. .............. 257/706 |
| 6,114,048 A | * | 9/2000 | Jech et al. .................. 428/547 |

FOREIGN PATENT DOCUMENTS

| EP | 0-521405 | 1/1993 |
| EP | 0717125 | 6/1996 |
| JP | 5-326767 | 12/1993 |

OTHER PUBLICATIONS

New Diamond (Jul. 25, 1994), vol. 10, No. 3, pp. 26 & 27 (English Abstract).

* cited by examiner

Primary Examiner—Archene Turner

(57) ABSTRACT

A thin diamond film layer is formed on a substrate with good adherence. A heatsink includes a substrate of a sintered compact including Cu and W, and a thin diamond film layer formed on the surface of the substrate. The Cu content in the substrate is at least 5% by weight. In an X-ray diffraction chart obtained by irradiating the thin diamond film layer with an X-ray, the diffraction peak intensity of the (110) plane of W is at least 100 times the diffraction peak intensity of the (200) plane of Cu.

32 Claims, 15 Drawing Sheets

× 27,000

× 27,000

HEATSINK AND FABRICATION METHOD THEREOF

BACKGROUND OF THE INVENTION

1. Field of the Invention

The present invention relates to a heatsink and a fabrication method thereof. Particularly, the present invention relates to a heatsink on which is mounted a semiconductor element of relatively great heat generation such as a laser diode, a CPU (central processing unit), a MPU (microprocessor unit), a high frequency amplifier device, and the like, having a multilayer structure of a diamond layer and a metal layer, and a method of fabricating such a heatsink.

2. Description of the Background Art

The aforementioned high power semiconductor devices generate a great amount of heat during operation. The heat generated by these semiconductor elements has become greater in accordance with improvement in the output and the operating frequency. The need of compact and light-weight electronic equipment is great in the industry while the packaging density of the semiconductor element is continuously increasing. The increase in the heat generation and packaging density of semiconductor elements implies more stringent requirements with respect to the heat radiation characteristic of the heatsink employed in modules in which high power semiconductor elements are mounted.

Regarding such heatsinks that require great heat dissipation, a semiconductor element is mounted on a heatsink formed of a material of high thermal conductivity to prevent the semiconductor element from becoming too hot. For heatsinks that incorporate high power semiconductor elements such as a high power transistor or microwave monothylic IC (MMIC) of great heat generation, beryllium oxide (BeO), for example, superior in thermal conductivity and dielectric property is conventionally used widely.

Diamond is known as the substance having the highest thermal conductivity. Research has been effected to apply diamond to the heatsink that is used for incorporating a semiconductor element.

As a heatsink employing diamond, development is in progress of a heatsink formed entirely of diamond, and a heatsink having a diamond film formed on a metal substrate.

Since natural diamond is precious and artificial diamond is costly, the cost of the heatsink will increase if the amount of diamond therein becomes greater. Therefore, a heatsink formed entirely of diamond is used with respect to a semiconductor element of high heat generation such as a high power laser only in the application where heat radiation is so insufficient that it prevents exhibition of proper performance when a substitute is used or in the application such as during the stage of research where the cost is not yet estimated. A heatsink having a diamond film formed on a metal substrate is used in products that must have the cost reduced.

By using a heatsink formed partially of metal, the cost can be decreased although the thermal conductivity is degraded in comparison to a heatsink formed only of diamond. Therefore, the cost and performance of the heatsink is substantially proportional. It can be said that a heatsink of higher thermal conductivity becomes more expensive. Therefore, there is a demand for an economical heatsink of high thermal conductivity.

In response to such demands, a heatsink of a multilayered structure with a thin diamond film formed on a metal of favorable thermal conductivity is disclosed in, for example, Japanese Patent Laying-Open No. 5-326767.

Conventionally, BeO superior in thermal conductivity has been widely used for the heatsink. However, the level of the heat radiation characteristic that is currently required has become so high that even BeO is even not sufficient. An approach has been made to reduce the thickness of the BeO substrate to reduce thermal resistance. However, it is difficult to process BeO per se. Furthermore, BeO is toxic. It can be said that reduction in the thickness has come to its limit.

As to the heatsink disclosed in the above publication, copper and copper-tungsten alloy which are metals of favorable thermal conductivity are mentioned as the substance of the substrate. These materials are suitable for the heatsink since the thermal conductivity thereof is high comparable to other metal materials and the cost is relatively low.

However, there was problem that it is difficult to grow a thin diamond film on a substrate that includes copper in favorable adherence since the copper in the substrate does not produce carbide, does not absorb carbon, and is not occluded with carbon, as described in New Diamond, Vol. 10, No. 3 (34), pp 26 and 27

Copper has a high thermal expansion coefficient whereas diamond has a low thermal expansion coefficient. Therefore, there is a problem that the thin diamond film will peel off the substrate as the temperature of the heatsink becomes higher due to the difference in thermal expansion coefficient between copper and diamond.

If the difference in thermal expansion between the substrate and the diamond is small, warping in the diamond heatsink will not occur. Only stress will be generated within the thin diamond film even when the heatsink attains high temperature. However, the thermal expansion of copper or a sintered compact including copper is greater than that of diamond, resulting in the problem of warping in the heatsink.

SUMMARY OF THE INVENTION

In view of the foregoing, an object of the present invention is to provide a heatsink that can have a thin diamond film formed in good adherence on a substrate of favorable thermal conductivity.

Another object of the present invention is to provide a heatsink that can have occurrence of warping suppressed.

According to an aspect of the present invention, a heatsink includes a substrate of a sintered compact including Cu and W, and a thin diamond film layer formed on the surface of the substrate. The Cu content in the substrate is at least 5% by weight. In an X-ray diffraction chart obtained by irradiating a thin diamond film layer with an X-ray, the diffraction peak intensity of the (110) plane of W is at least 100 times the diffraction peak intensity of the (200) plane of Cu.

In such a heatsink, the amount of W at the surface of the substrate is relatively great whereas the amount of Cu at the surface of the substrate becomes relatively smaller. Therefore, the adherence between the substrate and the thin diamond film layer formed on the surface of the substrate is improved. As a result, the heat locally generated from the semiconductor element mounted on the thin diamond film layer can be promptly dissipated at the in-plane of the thin diamond film layer by virtue of the effect of the thin diamond film layer as a heat spreader (effect of heat dissipation) to be conveyed to the substrate. The thermal conductivity of the substrate is increased since the Cu content in the substrate is at least 5% by weight.

In an X-ray diffraction chart obtained by irradiating the thin diamond film layer with an X-ray, it is preferable that a peak of WC (tungsten carbide) appears. In this case, the adherence between the thin diamond film layer and the substrate is improved.

According to another aspect of the present invention, a heatsink includes a substrate of a sintered compact including Cu and W, and a thin diamond film layer formed on the surface of the substrate. The Cu content in the substrate is at least 5% by weight. In an X-ray diffraction chart obtained by irradiating the thin diamond film layer with an X-ray, the diffraction peak intensity of the (211) plane of W is at least 30 times the diffraction peak intensity of the (200) plane of the Cu.

In such a heatsink, the amount of W at the surface of the substrate becomes relatively greater whereas the amount of Cu at the surface of the substrate becomes relatively smaller. Therefore, the adherence between the substrate and the thin diamond film layer formed on the surface of the substrate is improved. As a result, the heat locally generated from the semiconductor element mounted on the thin diamond film layer is rapidly dissipated at the in-plane of the thin diamond film layer to be subsequently conveyed to the substrate by virtue of the effect of the thin diamond film layer as a heat spreader (effect of heat dissipation). Also, the thermal conductivity of the substrate becomes higher since the Cu content in the substrate is at least 5% by weight.

In an X-ray diffraction chart obtained by irradiating the thin diamond film layer with an X-ray, it is preferable that a peak of WC (tungsten carbide) appears. In this case, the adherence between the thin diamond film layer and the substrate is improved.

According to a further aspect of the present invention, a heatsink includes a substrate including Cu and a metal of a low thermal expansion coefficient, and a thin diamond film layer formed on the surface of the substrate. The Cu content in the substrate is at least 5% by weight. The Cu content in the substrate becomes lower as a function of approaching the surface of the substrate.

In the heatsink of the above structure, the Cu content at the surface of the substrate is lowest. Therefore, the adherence between the substrate and the thin diamond film layer on the substrate is improved since the amount of Cu that does not easily attach to carbon is small at the surface of the substrate. As a result, the heat locally generated from the semiconductor element is rapidly dissipated at the in-plane of the thin diamond film layer to be subsequently conveyed to the substrate by virtue of the thin diamond film layer serving as a heatsink spreader (effect of heat dissipation). Also, the thermal conductivity of the substrate is increased since the Cu content in the substrate is at least 5% by weight.

The Cu content at a region of the substrate that is not more than 10 $\mu$m in depth from the surface of the substrate is preferably not more than 50% of the entire Cu content of the substrate. By adjusting the content amount of Cu at the surface of the substrate, adherence between the thin diamond film layer and the substrate is improved. If the Cu content at a region that is not more than 10 $\mu$m in depth from the surface of the substrate exceeds 50% of the entire Cu content of the substrate, the rate of presence of Cu becomes so high that the thin diamond film layer is easily peeled off the substrate. By setting the Cu content at the surface of the substrate to be less than 50% of the entire Cu content of the substrate, warping in the substrate can be suppressed due to an appropriate amount of Cu remaining in the substrate.

The substrate is preferably a Cu—W sintered compact or a Cu—W—Mo sintered compact. The Cu—W sintered compact or the Cu—W—Mo sintered compact must have a thermal conductivity of at least 100 W/m·K in order to exhibit the advantage of the present invention.

W particles are exposed at the surface of the substrate. The surface roughness $R_z$ of the W particle is preferably at least 0.05 $\mu$m. The diamond nucleus is easily generated from the convex portion of the W particle. By setting the surface roughness $R_z$ of the W particle as above, the nucleus generation density of diamond is improved. Therefore, the number of contact points between the substrate and the thin diamond film layer is increased. Thus, adherence between the thin diamond film layer and the substrate can further be improved.

If the surface roughness $R_z$ of the W particle is less than 0.05 $\mu$m, the nucleus generation density is reduced since the convex portion in the W particle is reduced. This means that the adherence between the thin diamond film layer and the substrate is degraded so that the thin diamond film layer easily peels off the substrate.

Preferably, an intermediate layer in which the Cu content is approximately 0% by weight is formed between the surface of the substrate and the thin diamond film layer. By provision of an intermediate layer that does not include Cu between the substrate and the thin diamond film layer, the thin diamond film layer will not come into contact with the Cu in the substrate. Therefore, adherence between the thin diamond film layer and the substrate is further improved.

The thickness of the substrate is preferably at least 200 $\mu$m and not more than 10000 $\mu$m. In order to maintain the strength as a substrate, the thickness of the substrate is preferably at least 200 $\mu$m. In order to avoid the thermal resistance of the heatsink from becoming too great, the substrate thickness is preferably not more than 10000 $\mu$m.

The thickness of the thin diamond film layer is preferably at least 10 $\mu$m. In this case, the thin diamond film layer functions to diffuse in-plane the heat generated by the semiconductor element to prevent the heat from being partially confined. The thickness of the thin diamond film layer must be at least 10 $\mu$m for this function.

The thermal conductivity of a thin diamond film layer is generally in the range of 500 W/m·K–2000 W/m·K depending upon the quality of the diamond. In the present invention, the thermal conductivity of the thin diamond film layer must be at least 700 W/m·K in order to exhibit the effect of the present invention.

Preferably, the substrate has a thermal conductivity of at least 100 W/m·K, and a thickness of at least 200 $\mu$m and not more than 700 $\mu$m, whereas the thin diamond film layer has a thickness of at least 10 $\mu$m and not more than 200 $\mu$m. Here, the thin diamond film layer expands analogous to the substrate since it is very thin. Therefore, the expansion of the thin diamond film layer and that of the semiconductor element provided thereon is substantially equal. Accordingly, cracking in the semiconductor element can be suppressed.

Furthermore, the thermal conductivity of the thin diamond film layer is preferably at least 100 W/m·K.

A method of fabricating a heatsink according to the present invention includes the steps of reducing the Cu content at the surface layer region of the substrate by immersing the surface of the substrate including Cu and a metal of a low thermal expansion coefficient in acid, and roughening the surface of the exposed metal of a low thermal expansion coefficient, and forming by vapor synthesis a thin diamond film layer on the surface of the substrate subjected to acid treatment.

According to the heatsink fabrication method including the above steps, the Cu content at the surface of the substrate is reduced by subjecting the surface of the substrate to acid treatment. Then, a thin diamond film layer is formed on the surface. Therefore, a thin diamond film layer can be formed on the substrate in good adherence.

The step of reducing the Cu content at the surface layer region of the substrate includes roughening the exposed surface of the metal of a low thermal expansion coefficient. Therefore, adherence between the thin diamond film layer and the substrate is further improved since the thin diamond film is formed on the roughened metal of low thermal expansion coefficient.

The acid is preferably a solution selected from the group consisting of hydrochloric acid, nitric acid, sulfuric acid, hydrofluoric acid (HF), hydrogen peroxide ($H_2O_2$) and chromic acid, or a mixed solution thereof. By using these acids, the surface of the substrate can be appropriately roughened to facilitate formation of the thin diamond film layer.

The step of reducing the Cu content at the surface layer region of the substrate preferably includes a first acid treatment step of immersing the surface of the substrate in a certain acid, and a second acid treatment step of immersing the substrate subjected to the first acid treatment in an acid different from the certain acid.

In forming a diamond film by vapor synthesis, a diamond nucleus is generated at a deep location from the surface of the substrate. In other words, the root of the thin diamond film is present at a deep region in the substrate, so that the anchor effect can be expected.

The substrate is preferably at least one type of a sintered compact selected from the group consisting of a Cu—W sintered compact, a Cu—Mo sintered compact and a Cu—W—Mo sintered compact.

W particles are exposed at the surface of the substrate immersed in acid. The surface roughness $R_z$ of the W particle is preferably at least 0.05 $\mu$m. By such a surface roughness, small particles of diamond permeate into the surface of the W particles. A thin diamond film layer is grown with the diamond particle as the nucleus. Thus, adherence between the thin diamond film layer and the substrate is improved.

The acid treatment that reduces the Cu content is preferably carried out until the peak of Cu is not detected in an X-ray diffraction chart obtained by irradiating the surface of the substrate with an X-ray.

In this case, the Cu content at the surface of the substrate is sufficiently reduced. Therefore, adherence between the substrate and the thin diamond film layer formed thereon is improved.

The acid treatment of reducing the Cu content is preferably carried out until the porosity of the region of the substrate that is within 30 $\mu$m in depth from the surface of the substrate is at least 5% by volume and not more than 70% by volume, and the Cu content at the region within 30 $\mu$m in depth from the surface of the substrate is not more than 50% of the entire Cu content of the substrate.

By setting the porosity to the above described range, the grains of diamond can easily permeate into the hole to facilitate nucleus generation.

If the porosity is less than 5% by volume, nucleus generation cannot easily occur. If the porosity is greater than 70% by volume, the holes become so great that the thermal conductance is reduced. As a result, the property as a heatsink will be degraded.

Further preferably, the porosity at the region within 30 $\mu$m in depth from the surface of the substrate is at least 10% by volume and not more than 50% by volume.

By setting the Cu content at the region of the substrate within 30 $\mu$m in depth from the surface of the substrate to be less than 50% of the entire Cu content of the substrate, warping of this heatsink will not easily occur.

Preferably, a step of carrying out a process of scratching the surface of the substrate is included prior to formation of the thin diamond film layer. In this case, diamond is easily nucleated from the scratch at the surface of the substrate. Many diamond nuclei can be generated at the surface of the substrate to promote the speed in the growth of the thin diamond film layer. Also, the thickness of the thin diamond film layer can be made uniform.

The scratching process preferably includes the step of scratching the surface of the substrate using diamond. In this case, diamond is attached to the surface of the substrate in the scratching step of the surface of the substrate to become the nucleus in forming the thin diamond film layer. Therefore, growth of the thin diamond film layer can further be promoted.

Vapor synthesis is used in forming a thin diamond film layer on the substrate. This vapor synthesis includes hot filament CVD (chemical vapor deposition), plasma CVD, flame method, and the like.

According to still another aspect of the present invention, a heatsink includes a substrate, and a thin diamond film layer formed on the substrate. The substrate includes a porous body of a low thermal expansion coefficient, and Cu filled in the hole of the porous body. At the surface layer of the substrate, a thin diamond film layer is present in the hole. The diamond film layer is permeating into the hole at a surface layer of the porous body.

In the heatsink of the above structure, the difference in thermal expansion coefficient between the substrate and the thin diamond film layer formed on the substrate is small since the porous body forming the substrate has a low thermal expansion coefficient. Adherence between the substrate and the thin diamond film layer is improved since the thin diamond film layer is present at the surface layer of the porous body. As a result, the thin diamond film layer can be prevented from peeling off the substrate even when the heatsink attains high temperature.

Preferably, the substrate has a thermal conductivity of at least 10 W/m·K and a thickness of at least 200 $\mu$m and not more than 700 $\mu$m whereas the thin diamond film layer has a thickness of at least 10 $\mu$m and not more than 200 $\mu$m. The thin diamond film layer expands substantially analogous to the substrate due to its small thickness. Therefore, the expansion of the thin diamond film layer is substantially equal to that of the semiconductor element provided thereon. As a result, cracking in the semiconductor element can be suppressed.

Furthermore, the thermal conductivity of the thin diamond film layer is preferably at least 1000 W/m·K.

The porous body is preferably at least one type of a sintered compact selected from the group consisting of a W sintered compact, a Mo sintered compact, and a W—Mo sintered compact.

Furthermore, the porosity of the porous body is preferably at least 15% by volume and not more than 60% by volume. If the porosity of the porous body is less than 15% by volume, the heat conductivity is reduced when the hole is filled with Cu. If the porosity exceeds 60% by volume, the thickness of the thin diamond film layer will become nonuniform.

A heatsink fabricating method according to the present invention includes the steps of forming a thin diamond film layer on the surface of a porous body having a low thermal expansion coefficient, and filing the hole of the porous body with Cu after formation of the thin diamond film layer.

According to the heatsink fabrication method including the above steps, a diamond nucleus is generated from the surface of the porous body in forming a thin diamond film layer. Therefore, the nucleus of the thin diamond film layer is generated from a deep portion remote from the surface of the porous body. In other words, the base of the thin diamond film layer is present at a deep region remote from the surface of the substrate. Therefore, the anchor effect can be expected.

Since a substrate of a porous body with a low thermal expansion coefficient is used, the amount of thermal expansion is small when a thin diamond film layer is grown. Since the amount of thermal expansion is small, warping that occurs by the difference in thermal expansion between the thin diamond film layer and the porous body can be suppressed during the stage of cooling the porous body after film growth.

Since Cu fills the hole of the porous body, the hole of the porous body is exactly filled with Cu that has favorable thermal conductivity. As a result, the thermal conductance of the substrate is improved. Accordingly, the thermal conductance of the entire heatsink is improved.

Since the porous body is absent of Cu during the stage of forming a thin diamond film layer on the porous body, the thin diamond film layer can be formed in favorable adherence on the porous body.

The step of forming a thin diamond film layer preferably includes the step of forming a thin diamond film layer on the surface of the porous body by vapor synthesis. Here, the vapor synthesis method includes the hot filament CVD (chemical vapor deposition), plasma CVD, flame method, and the like.

The porous body is preferably at least one type of a sintered compact selected from the group consisting of a W sintered compact, a Mo sintered compact, and W—Mo sintered compact.

The porosity of the porous body is preferably at least 15% by volume and not more than 60% by volume. By setting the porosity to the above range, generation of a diamond nucleus from the surface of the porous body is facilitated. The thermal conductivity when Cu is filled is increased to improve the thermal conductivity of the entire sink.

If the porosity is less than 15% by volume, a diamond nucleus cannot be easily generated from a deep region in the porous body. As a result, adherence between the porous body and the thin diamond film layer is degraded. Furthermore, the thermal conductance of the heatsink is degraded since the amount of Cu in the hole is reduced.

If the porosity exceeds 60% by volume, it will become difficult to form a thin diamond film layer of uniform thickness on the surface of the porous body although a diamond nucleus can be generated at a deep region of the porous body. Furthermore, although the generation density of the diamond nucleus is reduced and the grain of the diamond forming the thin diamond film layer is increased, the surface roughness of the thin diamond film layer becomes greater. Accordingly, there is a problem that the thickness of the thin diamond film layer is not uniform, and polishing the thin diamond film layer is time consuming.

The step of filling the hole of the porous body with Cu preferably includes the step of permeating molten Cu into the hole of the porous body.

The step of filling the hole of the porous body with Cu preferably includes the step of heating and melting Cu and permeating molten Cu in the hole after the porous body is placed on solid Cu.

By placing solid Cu on a heating device such as a heater, arranging the porous body thereon with a thin diamond film layer at the top surface and the Cu melted, the Cu will permeate into the porous body by the capillary action. According to this method, arrangement between Cu and the porous body is feasible. Furthermore, since the molten Cu can be suppressed from spattering around, adherence of contaminants on the surface of the thin diamond film layer can be prevented.

The step of filling the hole of the porous body with Cu preferably includes the step of heating and melting Cu to permeate the molten Cu into the hole after solid Cu is placed on the porous body where the thin diamond film layer is formed.

Since the solid Cu placed on the porous body is melted, the Cu permeates into the porous body by the weight and capillary action of the Cu. Therefore, the charging rate of Cu becomes faster.

The step of filling the hole of the porous body with Cu preferably includes the step of storing molten Cu in a container and immersing the porous body with the formed thin diamond film layer in the molten Cu to permeate the melted Cu into the hole.

Since the porous body is immersed in the molten Cu, Cu permeates equally from all the faces of the porous body except for the face where the thin diamond film layer is formed. Also, the permeation speed becomes faster.

Preferably, the step of scratching the surface of the porous body prior to formation of a thin diamond film layer is included. Since a diamond nucleus is easily generated from the scratch, many diamond nucleus are generated at the surface of the porous body. A thin diamond film layer is grown faster and with uniform thickness.

The scratching process preferably includes the step of scratching the surface of the porous body using diamond. Diamond is attached to the surface of the porous body during the stage of scratching the surface of the porous body. This diamond becomes the nucleus in forming a thin diamond film layer. Accordingly, the growth of the thin diamond film layer is facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
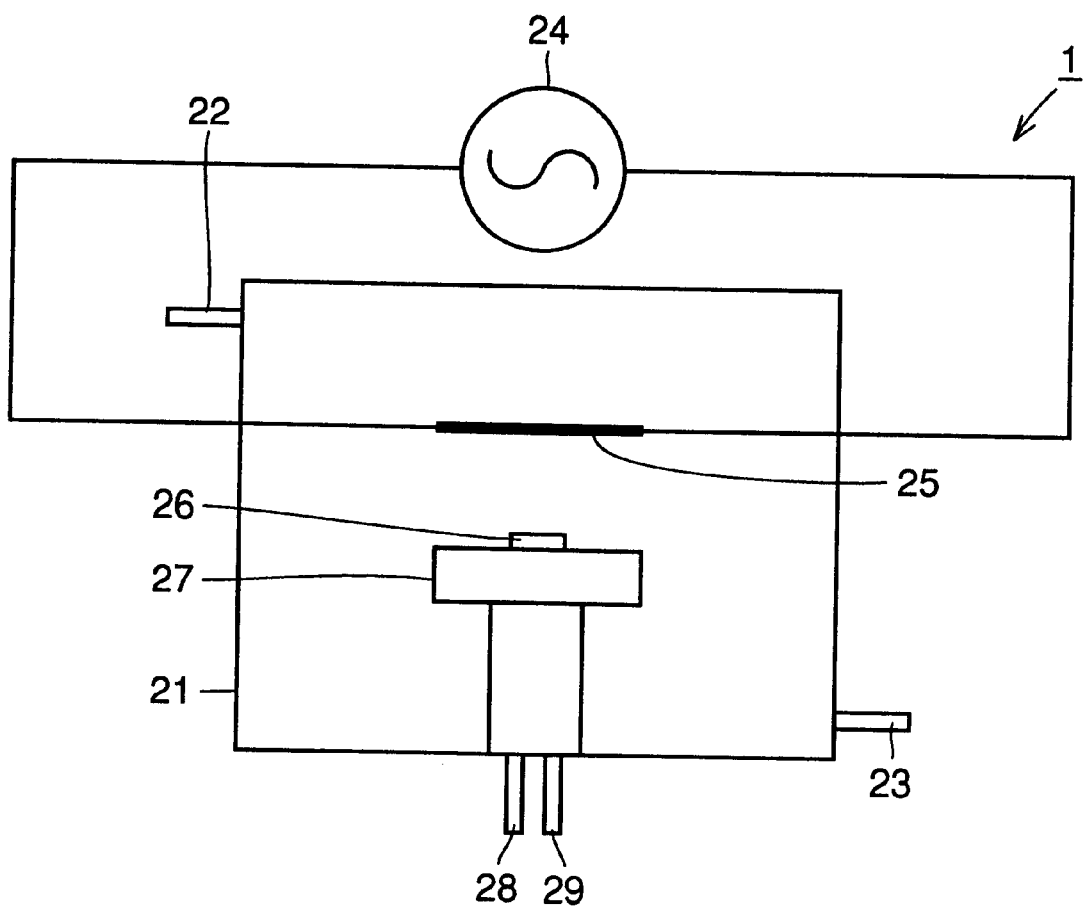
FIG. 1 is a schematic diagram of a hot filament CVD apparatus for diamond vapor synthesis employed in the present invention.

Referring to FIG. 1, a hot filament CVD (chemical vapor deposition) apparatus for diamond vapor synthesis employed in the present invention includes a reactor 21, a gas inlet 22, gas outlet 23, an AC power supply 24, a tungsten filament 25, a substrate holder 27, a cooling water inlet 28, and a cooling water outlet 29.

Reactor 21 includes gas inlet 22 through which material gas is introduced and gas outlet 23 from which the material gas or gas generated from the material gas is output.

Tungsten filament 25 is provided in reactor 21. Tungsten filament 25 is connected to AC power supply 24. Tungsten filament 25 is brought to red heat by conducting current from AC power supply 24 to tungsten filament 25.

A molybdenum substrate holder 27 is provided beneath tungsten filament 25 to hold a substrate. Since tungsten filament 25 attains a high temperature by being brought to red heat, this substrate holder 27 is also increased in temperature. Substrate holder 27 is provided with cooling water inlet 28 through which cooling water to cool substrate holder 27 is input and cooling water outlet 29 from which the cooling water is output.

A substrate formed of a Cu—W sintered compact having the Cu content of 11% by weight and the size of 13.5 mm×13.5 mm×0.635 mm (lengthwise×breadthwise×thickness) was prepared. An X-ray of a CuKα vessel was directed to the surface of the substrate to obtain an X-ray diffraction chart. The result is shown in FIG. 2.

Figure 2:
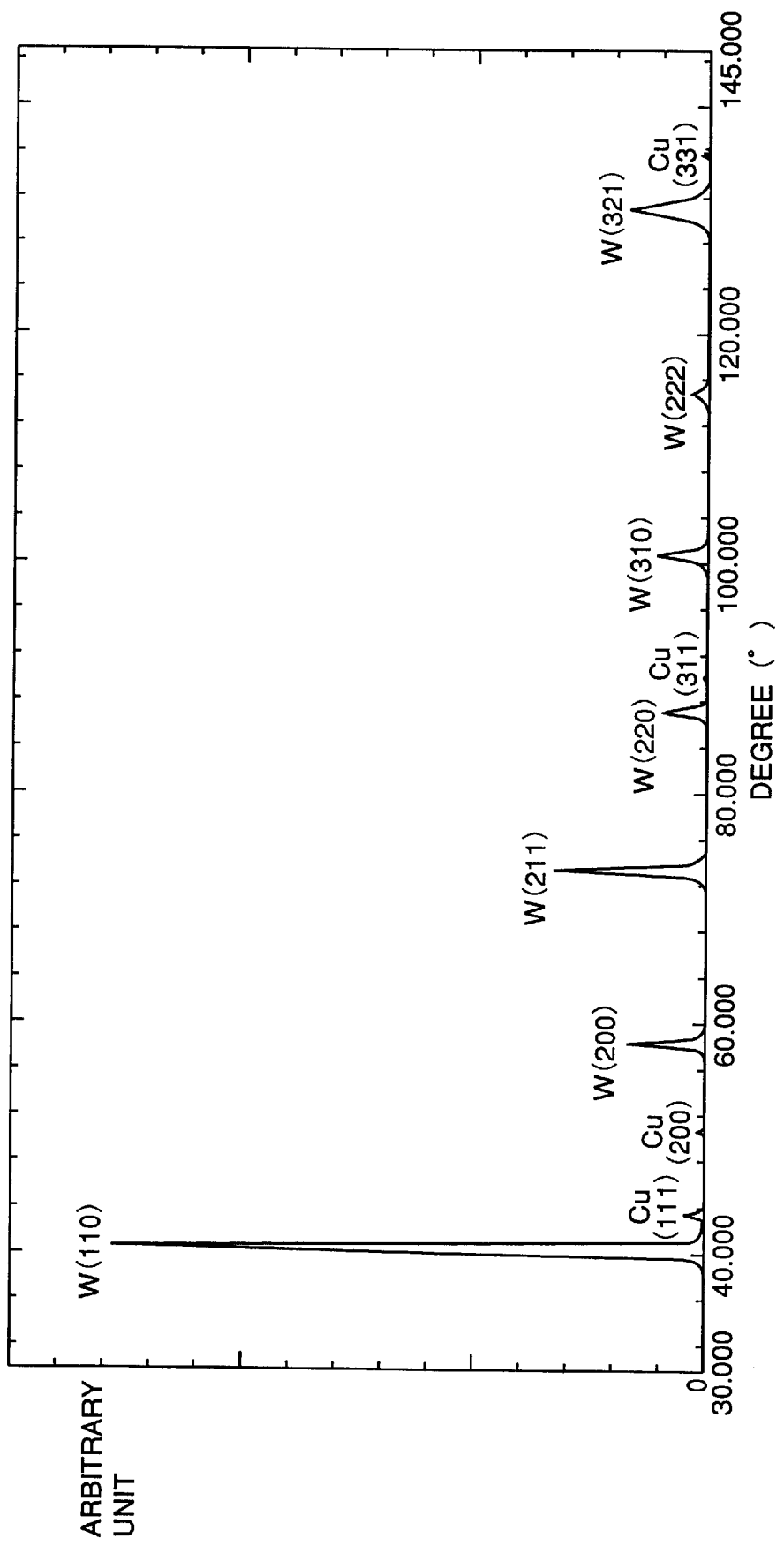
FIG. 2 is an X-ray diffraction chart obtained by irradiating a substrate prior to being immersed in acid with an X-ray.

It is appreciated from FIG. 2 that the peak arising from W (tungsten) is greater than the peak arising from Cu (copper). It is therefore understood that the amount of W is great at the surface of the substrate. Also, the relationship between the depth from the surface of the substrate and the concentration of each component was evaluated. The result is shown in FIG. 3.

Figure 3:
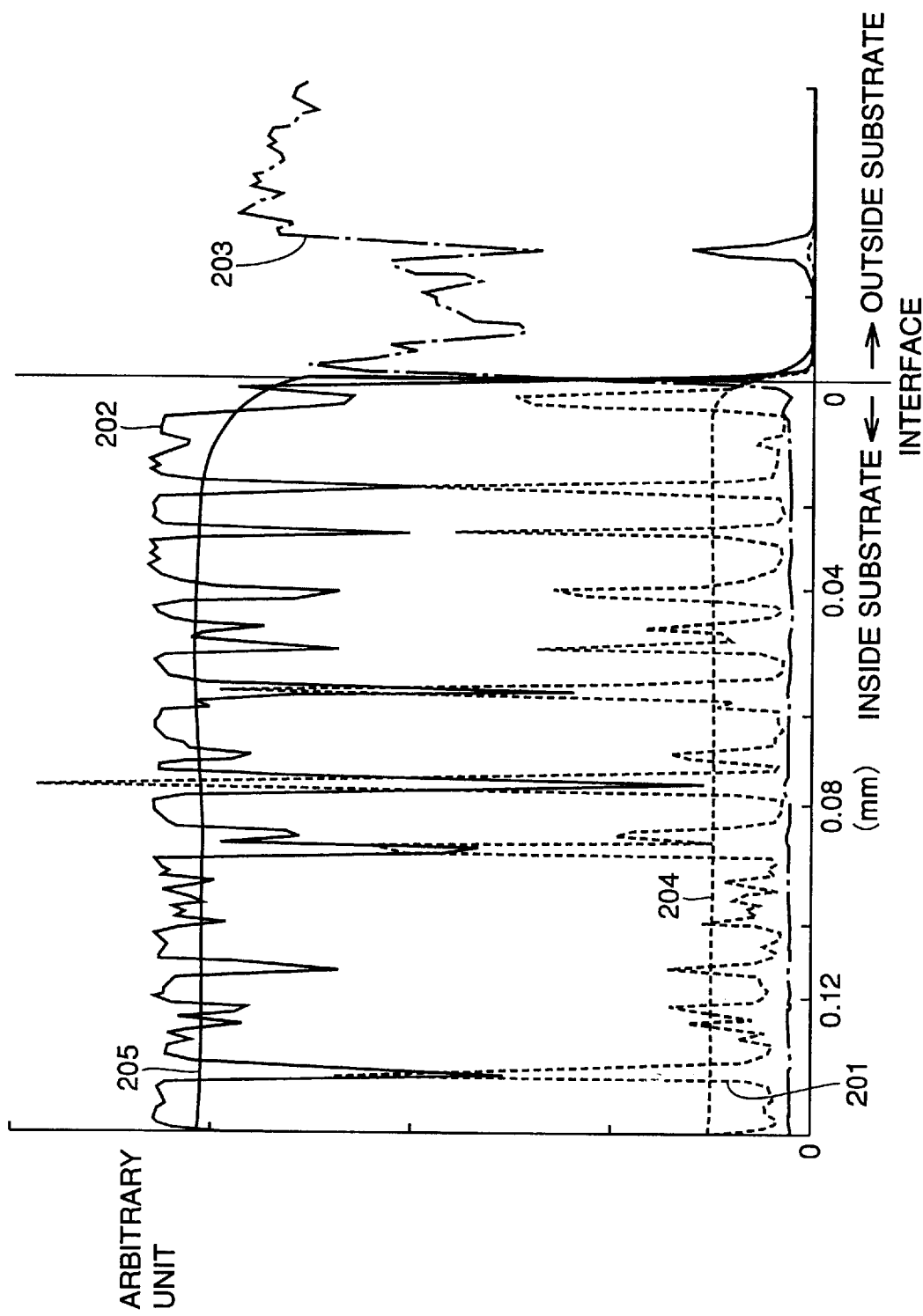
FIG. 3 is a graph showing the concentration of Cu, W and C in the substrate prior to immersion in acid.

In FIG. 3, dotted line 201 indicates the actually measured value of the concentration of Cu in the substrate. Dotted line 204 indicates an average of the actually measured values of the Cu concentration indicated by dotted line 201 for every 20 μm in depth. Solid line 202 indicates the actually measured value of the W concentration in the substrate. Solid line 205 shows the average of the measured values of W indicated by solid line 202 for every 20 μm in depth. Chain dotted line 203 indicates the concentration of C inside and outside the substrate. The C concentration outside the substrate is the concentration of C in the fixture jig to secure the substrate.

In FIG. 3, the depth from the interface is plotted along the abscissa, and an arbitrary amount is plotted along the ordinates. Therefore, the accurate ratio of the concentration of Cu to W is not represented. The same applies for subsequent FIGS. 4 and 6.

It is appreciated from FIG. 3 that the concentration of W and Cu is substantially constant within the substrate.

Figure 15:
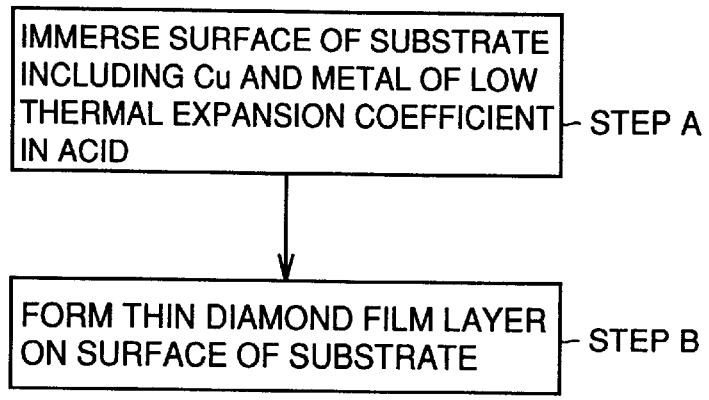
FIG. 15 shows the step of a heatsink fabricating method according to Example 1 of the present invention.

According to step A of FIG. 15, the above substrate was immersed for five minutes in a solution of mixed acid (mixture of hydrofluoric acid and nitric acid in the weight ratio of 1:1) diluted with pure water. The concentration of Cu and W within the substrate was measured. The result is shown in FIG. 4.

Figure 4:
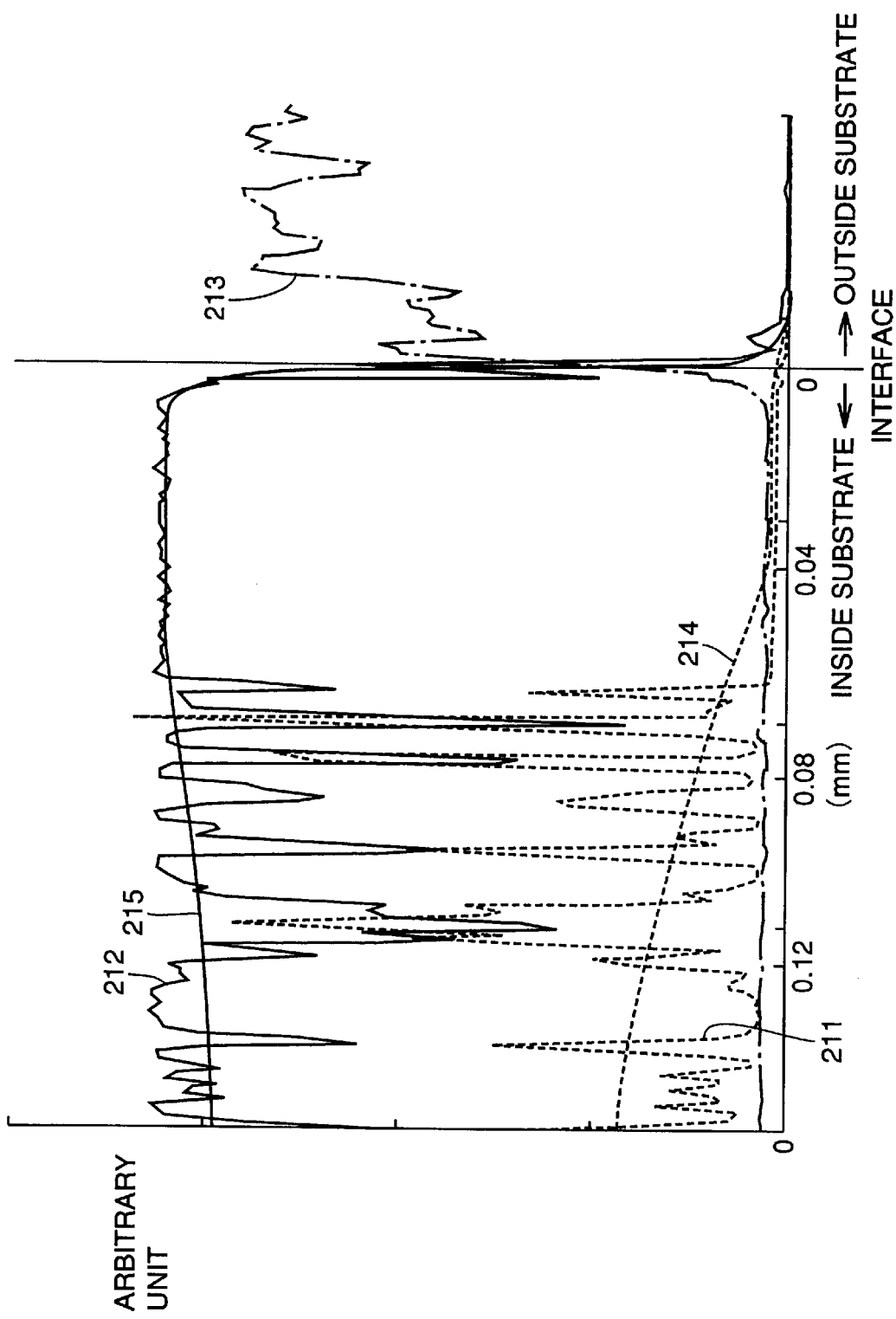
FIG. 4 is a graph showing the concentration of Cu, W and C in a substrate after immersion in acid and before formation of a thin diamond film layer.

In FIG. 4, dotted line 211 shows the measured value of the Cu concentration in the substrate. Dotted line 214 shows the average of the measured values of Cu indicated by dotted line 211 for every 20 μm in depth. Solid line 212 shows the measured value of the W concentration within the substrate. Solid line 215 shows the average of the measured values of the W concentration within the substrate indicated by solid line 212 for every 20 μm in depth. Although chain dotted line 213 shows the concentration of C outside and inside the substrate, the C concentration outside the substrate is the C concentration in the fixture jig that supports the substrate. It is appreciated from FIG. 4 that the Cu at the surface of the substrate is removed by the mixed acid so that the Cu concentration (Cu content) becomes lower as a function of approaching the surface of the substrate.

Following the process of scratching the surface of the substrate with diamond abrasive grains, a substrate 26 was placed on substrate holder 27 in hot filament CVD apparatus 1 of FIG. 1. Current was conducted from AC power supply 24 to tungsten filament 25 to set the temperature of tungsten filament 25 to approximately 2050° C.

Figure 16:
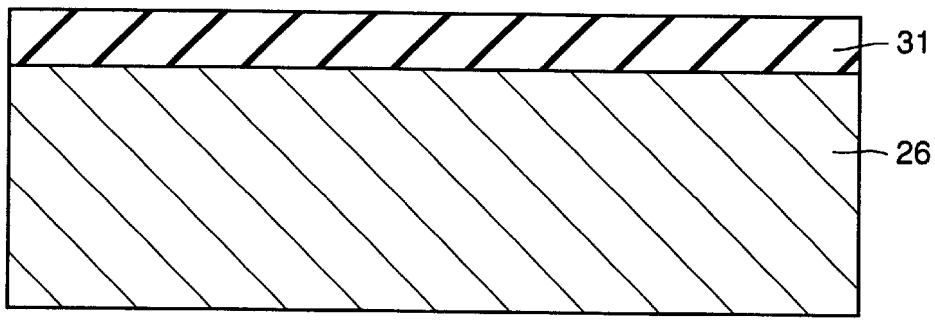
FIG. 16 is a schematic diagram of a thin diamond film layer produced according to Example 1 of the present invention.

Then, mixture gas of methane and hydrogen with the methane concentration of 1 mole % was introduced through gas inlet 22 into reactor 21. The pressure within reactor 21 was maintained at 70 Torr. According to step B of FIG. 15, a thin diamond film layer was grown on substrate 26 over the period of 40 hours. Thus, a thin diamond film layer 31 shown in FIG. 16 was obtained. The obtained thin diamond film layer 31 was 24 μm in thickness. The warp of substrate 26 was 3 μm.

The surface of thin diamond film layer 31 was polished to have a mirror face. Then, an X-ray generated from a CuKα vessel was directed onto the surface of thin diamond film layer 31 to obtain an X-ray diffraction chart. The obtained X-ray diffraction chart is shown in FIG. 5.

Figure 5:
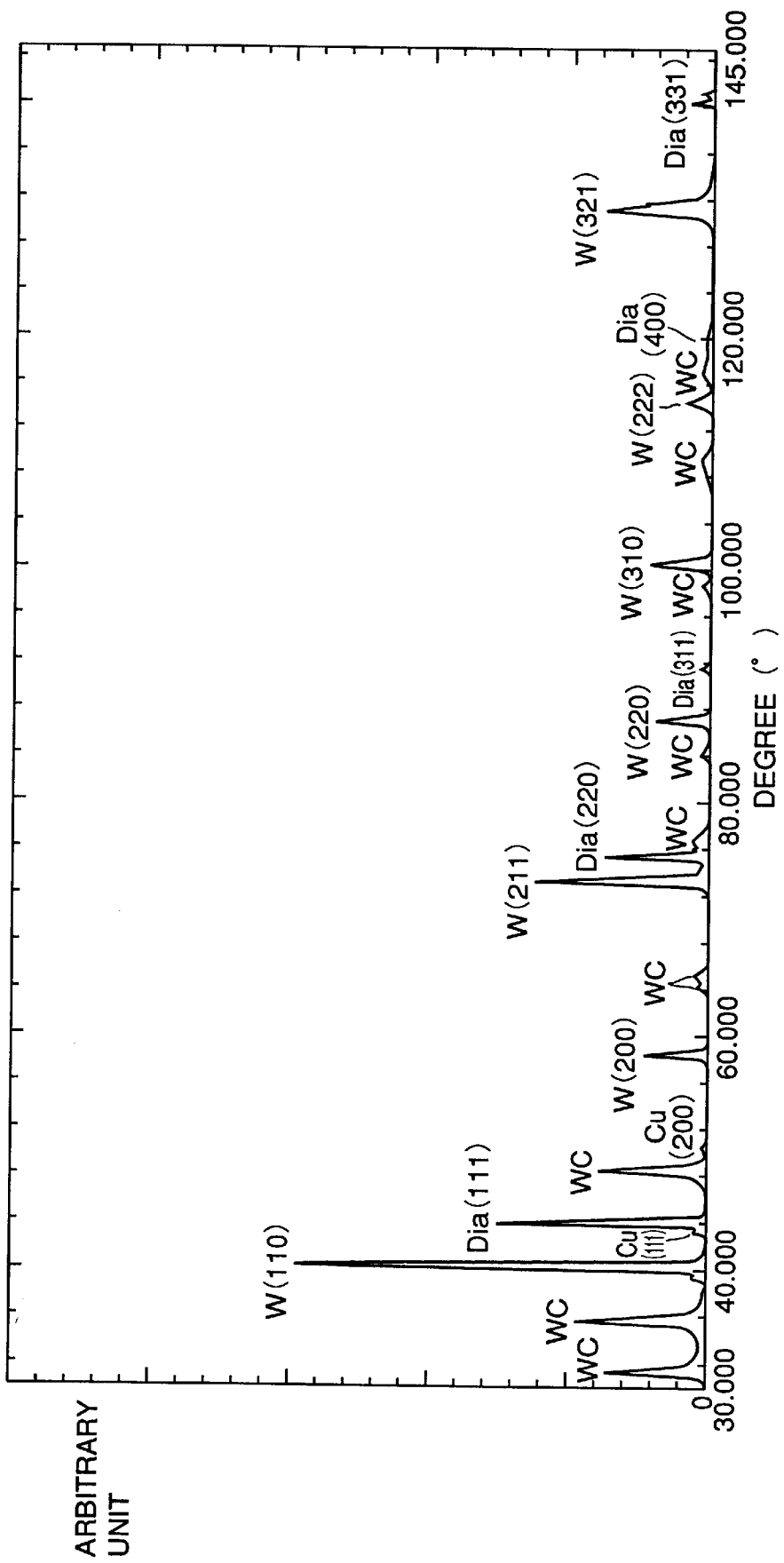
FIG. 5 is an X-ray diffraction chart obtained by irradiating a thin diamond film layer after formation with an X-ray.

Referring to FIG. 5, the ratio $I_W$ (110)/$I_{Cu}$ (200) of the peak intensity (height) $I_W$ (110) of the (110) plane of W to the peak intensity (height) $I_{Cu}$ (200) of the (200) plane of Cu was 119. The ratio of the peak intensity (height) $I_W$ (211) of the (211) plane of W to the peak intensity (height) $I_{Cu}$ (200) of the (200) plane of Cu was 50. The relationship between the depth from the interface of substrate 26 and thin diamond film layer 31 and the concentration of each component was evaluated. The result is shown in FIG. 6.

Figure 6:
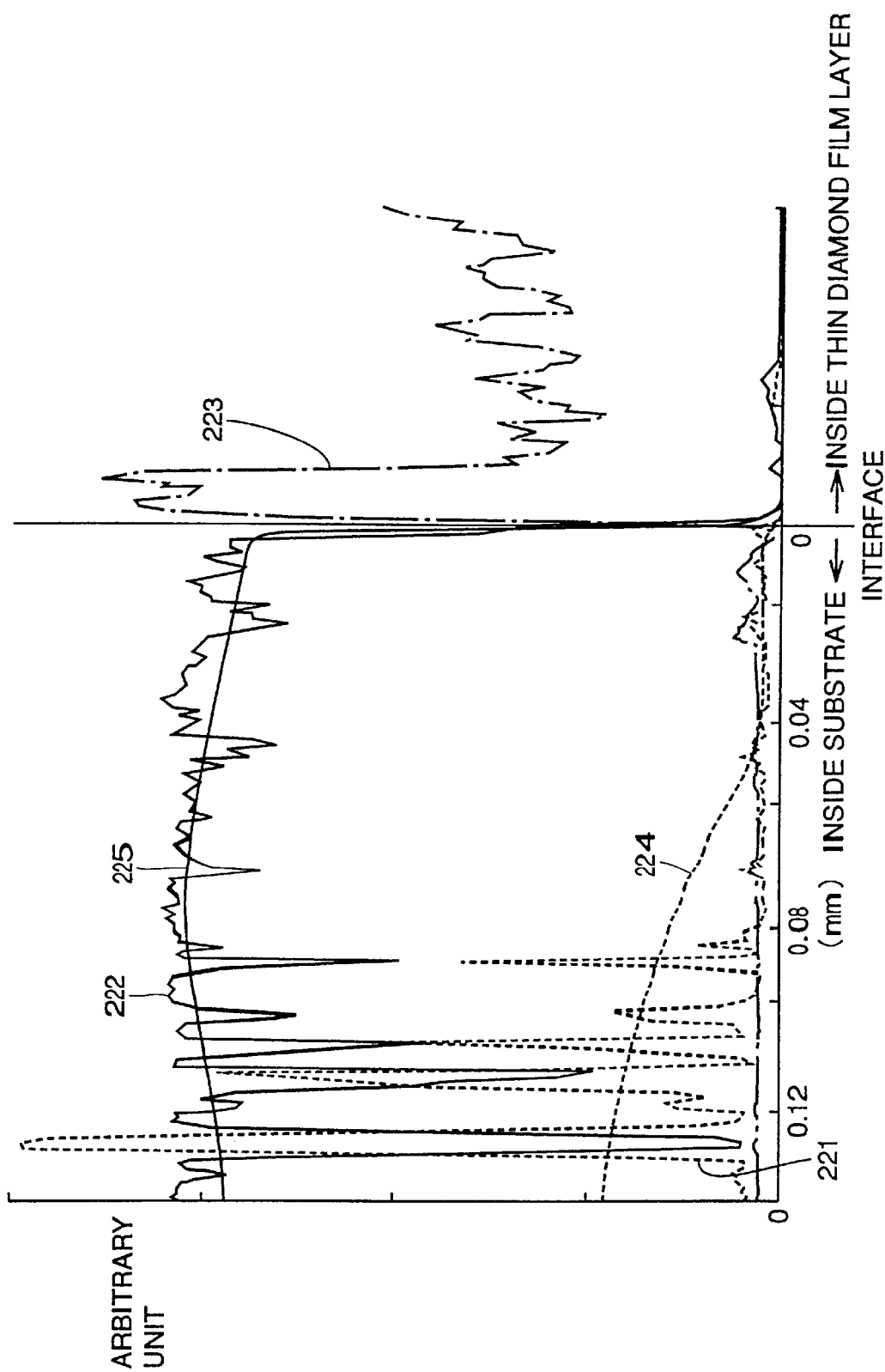
FIG. 6 is a graph showing the concentration of Cu, W and C in a substrate after formation of a thin diamond film layer and in the thin diamond film layer.

In FIG. 6, dotted line 221 shows the measured value of the Cu concentration in the substrate. Dotted line 224 shows the average of the measured values of the Cu concentration indicated by dotted line 221 for every 20 μm in depth. Solid line 222 shows the measured value of the W concentration inside the substrate. Solid line 225 shows the average of the measured values of W indicated by solid line 222 for every 20 μm in depth. Chain dotted line 223 shows the concentration of C inside and outside the substrate.

It is appreciated from FIG. 6 that the Cu concentration (content) becomes smaller as a function of coming closer to the surface of the substrate. The Cu content at the region located within 10 μm in depth from the surface of the substrate was not more than 50% of the entire Cu content (11% by weight) of the substrate.

Thin diamond film layer 31 did not peel off substrate 26 even when substrate 26 was cut to the size of 2 mm×1 mm×0.635 mm (lengthwise×breadthwise×thickness). Then, a laser diode was mounted on the heatsink produced by applying metallization. The laser diode exhibited stable oscillation. It is therefore appreciated that this heatsink is sufficient for practical usage.

Comparative Example 1

A substrate was prepared formed of a Cu—W sintered compact with the Cu content of 11% by weight in the size of 13.5 mm×13.5 mm×0.635 mm (lengthwise×breadthwise× thickness). This substrate was immersed for 30 seconds in a solution of nitric acid diluted with pure water. A process of scratching the surface of the substrate with diamond abrasive grains was carried out. Then, substrate 26 was placed on substrate holder 27 in hot filament CVD apparatus 1.

The temperature of tungsten filament 25 was set to approximately 2050° C. Mixture gas of methane and hydrogen with the methane concentration of 1 mole % was introduced into reactor 21 through gas inlet 22. The pressure in reactor 21 was 70 Torr. A thin diamond film layer was grown on the substrate over 40 hours under the above conditions. The thin diamond film layer was 23.5 μm in thickness and the warp of the substrate was 3.4 μm.

The thin diamond film layer had its surface polished to have a mirror face and then irradiated with an X-ray generated from a CuKα vessel to obtain an X-ray diffraction chart. The ratio of the peak intensity (height) of the (110) plane of W to the peak intensity of the (200) plane of Cu was obtained from the X diffraction chart. The peak intensity ratio was 65. This substrate was cut out to the size of 2 mm×1 mm×0.635 mm (lengthwise×breadthwise× thickness). It was found that the thin diamond film layer peeled off the substrate.

Example 2

Figure 17:
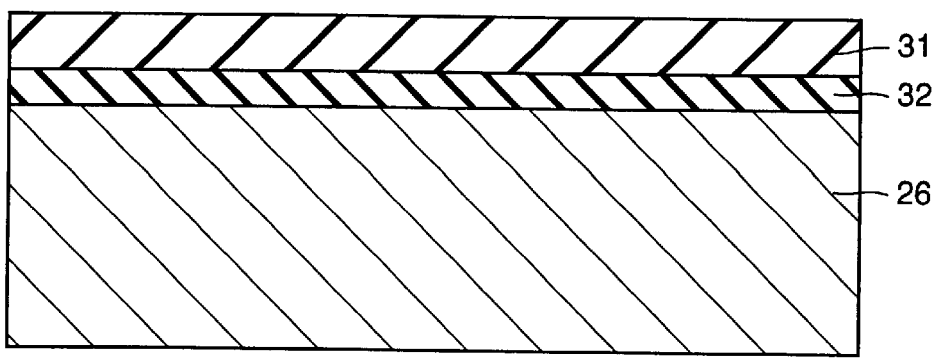
FIG. 17 is a schematic diagram of a thin diamond film layer formed on an intermediate layer, produced according to Example 2 of the present invention.

A substrate 26 was prepared formed of a Cu—W sintered compact with the Cu content of 15% by weight and 13.5 mm×13.5 mm×0.635 mm in size (lengthwise×breadthwise× thickness) as shown in FIG. 17. The surface of substrate 26 was roughened so that the surface roughness $R_Z$ of the substrate was 1 μm. Here, $R_Z$ refers to the ten point height of irregularities defined by JIS (Japanese Industrial Standards).

On the surface subjected to the above roughening process, SiC 32 as shown in FIG. 17 was deposited to 3 μm in thickness as an intermediate layer not including Cu. The surface of the intermediate layer was scratched with diamond abrasive grains. Then, substrate 26 was mounted on substrate holder 27 in hot filament CVD apparatus 1 of FIG. 1. The temperature of tungsten filament 25 was set to approximately 2100° C. Mixture gas of methane and hydrogen with the methane concentration of 1 mole % was introduced into reactor 21 through gas inlet 22. The pressure within reactor 21 was set to 70 Torr. A thin diamond film layer 31 as shown in FIG. 17 was grown on substrate 26 over 40 hours under the above conditions. The obtained thin diamond film layer 31 had a thickness of 22 μm. The warp of substrate 26 was 2.5 μm. Thin diamond film layer 31 had its surface polished to have a mirror face and then irradiated with an X-ray generated from a CuKα vessel to obtain an X-ray diffraction chart. From this X-ray diffraction chart, the ratio $I_W$ (211)/$I_{Cu}$ (200) of the peak intensity (height) $I_W$ (211) by the (211) plane of W to the peak intensity (height) $I_{Cu}$ (200) of the (200) plane of Cu was 47.

Then, the substrate was cut to the size of 2 mm×1 mm×0.635 mm (lengthwise×breadthwise×thickness). However, thin diamond film layer 31 did not peel off substrate 26. Then, the plane of substrate 26 opposite to the plane where thin diamond film layer 31 is formed was polished, and then subjected to metallization to produce a heatsink. A laser diode was installed on the heatsink. The laser diode exhibited oscillation. It is therefore appreciated that this heatsink is sufficient for practical usage.

Comparative Example 2

A substrate of 13.5 mm×13.5 mm×0.635 mm (lengthwise×breadthwise×thickness) in size was prepared, formed of a Cu—W sintered compact with the Cu content of 15% by weight. The surface of this substrate was subjected to a roughening process so that the surface roughness $R_Z$ of the surface of the substrate was 5 μm. Following the roughening process, SiC of 12 μm in thickness was deposited as an intermediate layer not including Cu on the surface.

The surface of the intermediate layer was subjected to a process of scratching the surface with diamond abrasive grains. Substrate 26 was placed on substrate holder 27 in hot filament CVD apparatus 1 shown in FIG. 1. The temperature of tungsten filament 25 was set to approximately 2100° C. Mixture gas of methane and hydrogen with the methane concentration of 1 mole % was introduced into reactor 21 through gas inlet 22. The pressure in reactor 21 was set to 70 Torr. A thin diamond film layer was grown on the substrate over 40 hours under the above conditions. The thickness of the thin diamond film layer was 23 μm. The warp of the substrate was 3.5 μm.

The thin diamond film layer had its surface polished to result in a mirror face, and then irradiated with an X-ray generated from a CuKα vessel to obtain an X-ray diffraction chart. According to this X-ray diffraction chart, the ratio $I_W$ (211) $I_{Cu}$ (200) of the peak intensity (height) $I_W$ (211) of the (211) plane of W to the peak intensity (height) $I_{Cu}$ (200) of the (200) plane of Cu was 18. The substrate was cut out to the size of 2 mm×1 mm×0.635 mm (lengthwise× breadthwise×thickness). The thin diamond film layer peeled off the substrate.

Example 3

Figure 7:
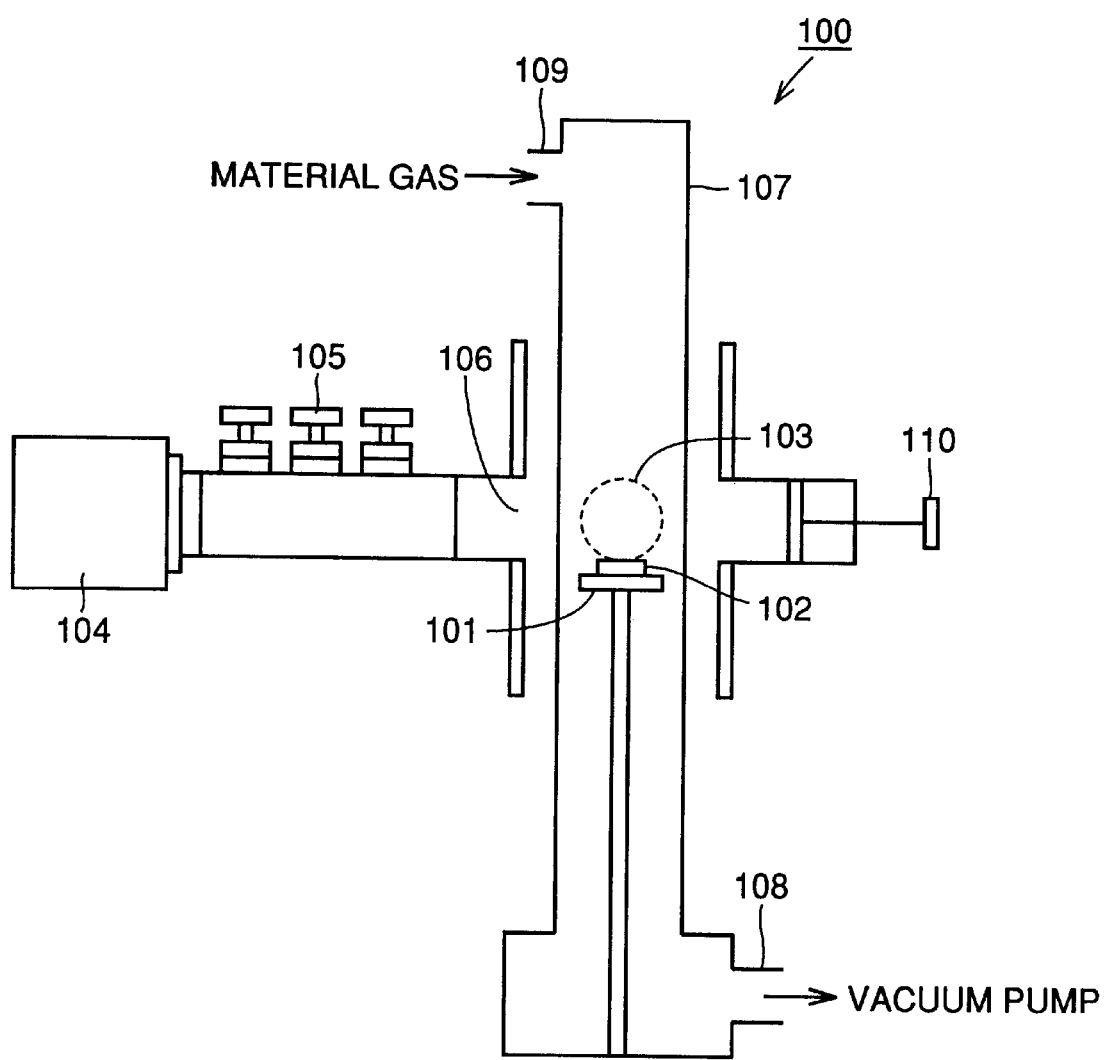
FIG. 7, is a schematic diagram of a microwave plasma CVD apparatus for diamond vapor synthesis employed in the present invention.

FIG. 7 is a schematic diagram showing a microwave plasma CVD apparatus for diamond vapor synthesis employed in the present invention. Microwave plasma CVD apparatus 100 includes a substrate holder 101, a microwave power source 104, a tuner 105, a wave guide 106, a reactor 107, an outlet 108, an inlet 109, and a plunger 110.

Substrate holder 101 for supporting a substrate is provided within reactor 107. Reactor 107 includes inlet 109 from which material gas is introduced and outlet 108 from which the material gas or gas generated by the reaction is output. Outlet 108 is connected to a vacuum pump. Microwave power source 104, an isolator (not shown) and a tuner 105 form the microwave generation unit. Reactor 107 is formed of a quartz tube.

The microwave generated from the microwave generation unit is directed towards plunger 110 via wave guide 106. Since reactor 107 is provided in the passage of wave guide 106, plasma is generated within reactor 107 as indicated by the circled dotted line 103. Plasma is generated at the area where reactor 107 crosses wave guide 106. Therefore, substrate holder 101 is provided in the proximity of this crossing position.

A substrate of 13.5 mm×13.5 mm×1 mm (lengthwise×breadthwise×thickness) was prepared, formed of a Cu—W sintered compact with the Cu content of 11% by weight. This substrate was immersed for two minutes in a solution of mixed acid (mixture of hydrofluoric acid and nitric acid in the weight ratio of 1:1) diluted with pure water. The surface of the substrate was subjected to the process of scratching the surface with diamond abrasive grains. Then, substrate 102 was placed on substrate holder 101 in microwave plasma CVD apparatus 100.

The temperature of substrate 102 was set to 850° C. Mixture gas of methane and hydrogen with the methane concentration of 3 mole % was introduced through inlet 109. The pressure within reactor 107 was maintained at 140 Torr. Plasma was generated in reactor 107. A thin diamond film layer was formed on substrate 102 over 20 hours under the above conditions. The thin diamond film layer had a thickness of 22 $\mu$m. The warp of the substrate was 4 $\mu$m.

The thin diamond film layer had its surface polished to have a mirror face, and then irradiated with an X-ray generated from a CuKα vessel to obtain an X-ray diffraction chart. The obtained X-ray diffraction is shown in FIG. 8.

Figure 8:
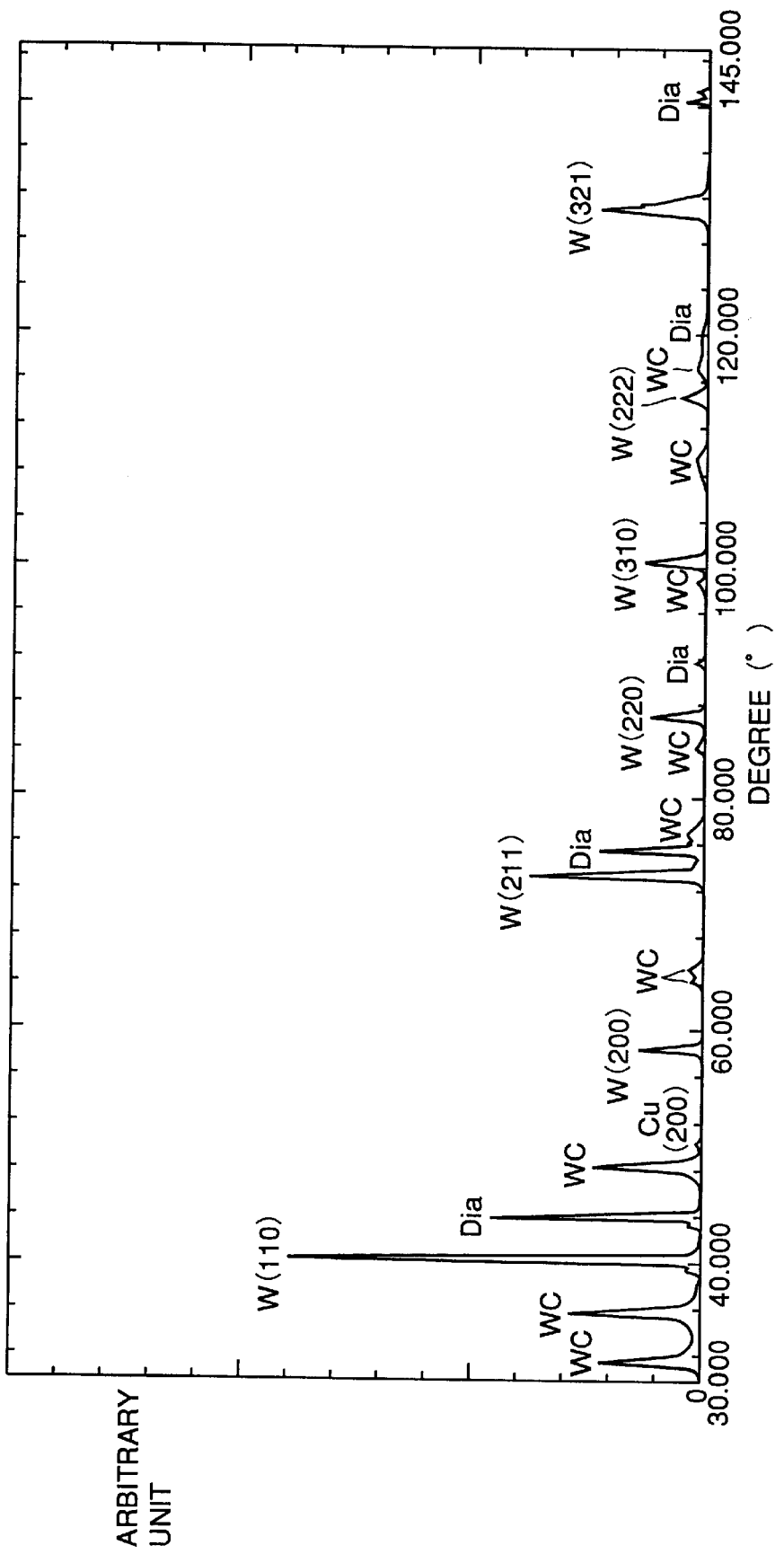
FIG. 8 is an X-ray diffraction chart obtained by irradiating the thin diamond film layer obtained in Example 3 with an X-ray.

According to the chart of FIG. 8, the ratio $I_W$ (110)/$I_{Cu}$ (200) of the peak intensity (height) $I_W$ (110) of the (110) plane of W to the peak intensity (height) $I_{Cu}$ (200) of the (200) plane of Cu was 140. The ratio $I_W$ (211)/$I_{Cu}$ (200) of the peak intensity (height) $I_W$ (211) of the (211) plane of W to the peak intensity (height) $I_{Cu}$ (200) of the (200) plane of Cu was 50.

Figure 9:
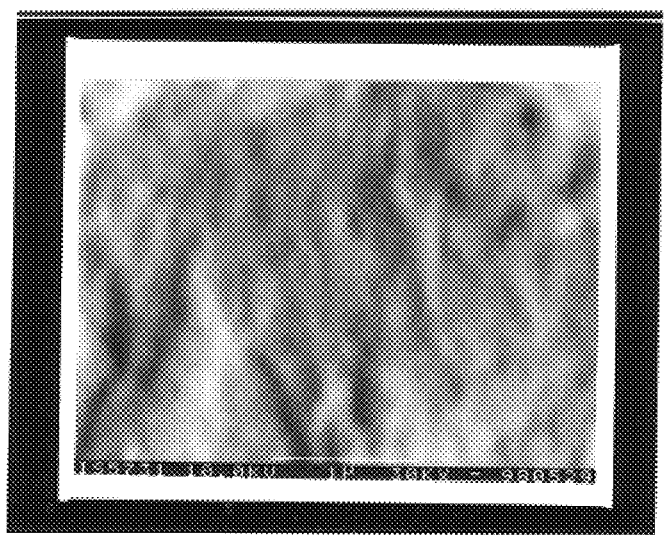
FIG. 9 is a scanning type electron microphotograph of a certain portion of a sample obtained by Example 3.

Even when a plurality of substrates were formed by cutting out the substrate at the size of 2 mm×1 mm×1 mm (lengthwise×breadthwise×thickness), the thin diamond film layer did not peel off the substrate. One of the plurality of substrates had the thin diamond film layer peeled off intentionally to observe an area range of 3×4 $\mu$m$^2$ of the surface of the substrate with a 3D-SEM (three dimensional scanning electron microscope) of the ERA 8000 type from ELIONIX. The observed result is shown in FIG. 9.

Figure 10:
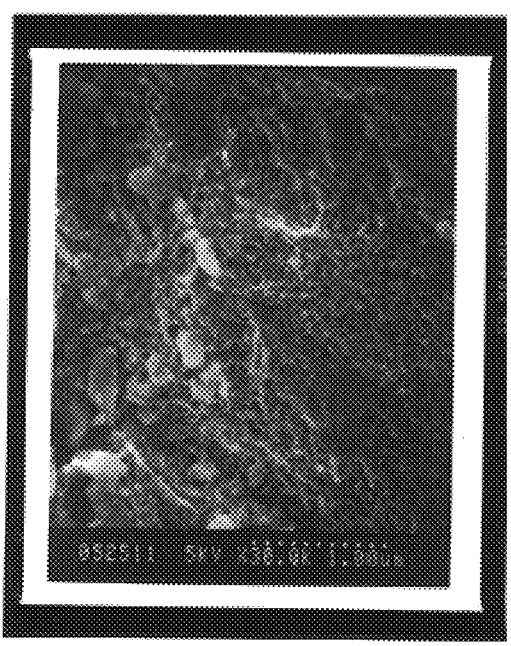
FIG. 10 is a scanning type electron microphotograph of another portion of a sample obtained by Example 3.

W particles were exposed at the surface of the substrate from the observed result. The surface roughness $R_Z$ of the W particle was measured. The surface roughness $R_Z$ was 0.09 $\mu$m. Another area of the surface of the substrate was observed with a FESEM (field emission scanning electron microscope). The observed result is shown in FIG. 10.

One of the plurality of substrates cut up had the surface opposite to the surface where the thin diamond film layer is formed polished and subjected to metallization to produce a heatsink. A laser diode was installed on this heatsink. The laser diode exhibited stable oscillation. It is therefore appreciated that this heatsink is sufficient for practical usage.

Example 4

A porous body of 10 mm×10 mm×0.3 mm (lengthwise×breadthwise×thickness) in size was prepared, formed of a W sintered compact with the porosity of 27.5% by volume. Cu was permeated into the hole of the porous body. Accordingly, the entire Cu content of the substrate was set to 10% by weight, and the Cu content at the region of 10 $\mu$m in depth from the surface where a thin diamond film layer is to be formed was set to 3% by weight.

The surface of the substrate was subjected to a scratching process using diamond abrasive grains. Substrate 102 was mounted on substrate holder 101 in microwave plasma CVD apparatus 100 shown in FIG. 7. The temperature of substrate 102 was set to 850° C. Mixture gas of methane and hydrogen with the methane concentration of 3.5 mole % was introduced into reactor 107 through inlet 109. The pressure in reactor 107 was set to 140 Torr. A thin diamond film layer was grown on substrate 102 over 20 hours. The thin diamond film layer had a thickness of 25 $\mu$m. The warp of the substrate was 2.7 $\mu$m.

The surface of the thin diamond film layer was polished to have a mirror face. The substrate was cut to the size of 2 mm×1 mm×0.3 mm (lengthwise×breadthwise×thickness). The thin diamond film layer did not peel off the substrate. Then, the substrate was subjected to metallization to produce a heatsink. A laser diode was installed on this heatsink. The laser diode exhibited stable oscillation. It is therefore appreciated that this heatsink is sufficient for practical usage.

Example 5

A substrate of 10 mm×10 mm×0.3 mm (lengthwise×breadthwise×thickness) was prepared, formed of a Cu—W—Mo sintered compact with the Cu content of 15% by weight. This substrate was immersed for three minutes in a solution of nitric acid diluted with pure water. The surface of this substrate was subjected to a scratching process with diamond abrasive grains. Then, substrate 206 was mounted on substrate holder 27 in hot filament CVD apparatus 1 shown in FIG. 1.

The temperature of tungsten filament 25 was set to approximately 2100° C. Mixture gas of methane and hydrogen with the methane concentration of 2 mole % was introduced into reactor 21 through gas inlet 22. The pressure in reactor 21 was set to 70 Torr. A thin diamond film layer was grown on the substrate over 40 hours under the above conditions. The thin diamond film layer had a thickness of 22 $\mu$m. The warp in the substrate was 3 $\mu$m.

The thin diamond film layer had its surface polished to have a mirror face, and then irradiated with an X-ray generated from a CuKα vessel to obtain an X-ray diffraction chart. According to this X-ray diffraction chart, the ratio $I_W$ (110)/$I_{Cu}$ (200) of the peak intensity (height) $I_W$ (110) of the (110) plane of W to the peak intensity (height) $I_{Cu}$ (200) of the (200) plane of Cu was 120.

This substrate was cut to the size of 2 mm×1 mm×0.3 mm (lengthwise×breadthwise×thickness). The thin diamond film layer did not peel off the substrate. Then, the face of the substrate opposite to the face where the thin diamond film layer is formed was subjected to metallization to produce a heatsink. A laser diode was installed on this heatsink. This laser diode exhibited oscillation. It is therefore appreciated that this heatsink is sufficient for practical usage.

Example 6

A substrate of 13.5 mm×13.5 mm×0.6 mm (lengthwise×breadthwise×thickness) was prepared formed of a Cu—W sintered compact with the Cu content of 11% by weight. This substrate was immersed in aqua regia (a solution having concentrated nitric acid and concentrated hydrochloric acid mixed at the volume ratio of 1:3) for approximately eight minutes. The surface of this substrate was subjected to a scratching process with diamond abrasive grains. Then, substrate 26 was mounted on substrate holder 27 in hot filament CVD apparatus of FIG. 1.

The temperature of tungsten filament 25 was set to approximately 2000° C. Mixture gas of methane and hydrogen with the methane concentration of 2 mole % was introduced into reactor 21 through gas inlet 22. The pressure within reactor 21 was maintained at 60 Torr. A thin diamond film layer was grown on substrate 26 over 45 hours under the above conditions. The obtained thin diamond film layer had a thickness of 25 $\mu$m. The warp of the substrate was 2 $\mu$m.

The thin diamond film layer had its surface polished to have a mirror face, and then irradiated with an X-ray generated from a CuK$\alpha$ vessel to obtain an X-ray diffraction chart. According to the obtained X-ray diffraction chart, the ratio $I_W$ (211)/$I_{Cu}$ (200) of the peak intensity (height) $I_W$ (211) of the (211) plane of W to the peak intensity (height) $I_{Cu}$ (200) of the (200) plane of Cu was 45.

The substrate was cut to the size of 2 mm×1 mm×0.6 mm (lengthwise×breadthwise×thickness). The thin diamond film layer did not peel off the substrate. Then, the substrate was subjected to metallization to produce a heatsink. A laser diode was installed on the heatsink. This laser diode exhibited stable oscillation. It is therefore appreciated that this heatsink is sufficient for practical usage.

Example 7

A substrate of 13.5 mm×13.5 mm×0.635 mm (lengthwise×breadthwise×thickness) was prepared formed of a Cu—W sintered compact with the Cu content of 11% by weight. Si of 5 $\mu$m in thickness was deposited as an intermediate layer not including Cu on the surface of this substrate. This intermediate layer was subjected to a scratching process with diamond abrasive grains. Substrate 102 was placed on substrate holder 101 in microwave plasma CVD apparatus 100 shown in FIG. 7.

The temperature of substrate 102 was set to approximately 900° C. Mixture gas of methane and hydrogen with the methane concentration of 2.5 mole % was introduced into reactor 107 through gas inlet 109. The pressure within reactor 107 was maintained at 100 Torr. A thin diamond film layer was grown on substrate 102 over 30 hours. The thickness of the thin diamond film layer was 23 $\mu$m. The warp of the substrate was 4 $\mu$m.

The thin diamond film layer had its surface polished to have a mirror face, and then irradiated with an X-ray generated from a CuK$\alpha$ vessel to obtain an X-ray diffraction chart. According to the X-ray diffraction chart, the ratio $I_W$ (110)/$I_{Cu}$ (200) of the peak intensity (height) $I_W$ (110) of the (110) plane of W to the peak intensity (height) $I_{Cu}$ (200) of the (200) plane of Cu was 130. A substrate of 2 mm×1 mm×0.635 mm (lengthwise×breadthwise×thickness) was cut. The thin diamond film layer did not peel off the substrate. Then, the substrate was subjected to metallization to produce a heatsink. A laser diode was installed on the heatsink. This laser diode exhibited stable oscillation. It is therefore appreciated that this heatsink is sufficient for practical usage.

Example 8

A substrate of 13.5 mm×13.5 mm×0.6 mm (lengthwise×breadthwise×thickness) formed of a Cu—W sintered compact with the Cu content of 15% by weight was prepared. This substrate was immersed for one minute in a solution of mixed acid (mixture of hydrofluoric acid and nitric acid in the weight ratio of 1:1) diluted with pure water. The surface of this substrate was subjected to a scratching process with diamond abrasive grains. Then, substrate 26 was placed on substrate holder 27 in hot filament CVD apparatus 1 of FIG. 1.

The temperature of tungsten filament 25 was set to approximately 2100° C. Mixture gas of methane and hydrogen with the methane concentration of 1 mole % was introduced into reactor 21 through gas inlet 22. The pressure in reactor 21 was set to 70 Torr. A thin diamond film layer was grown on substrate 26 over 44 hours under the above conditions. The thin diamond film layer had a thickness of 21 $\mu$m. The warp of the substrate was 3 $\mu$m.

The thin diamond film layer had its surface polished to have a mirror face, and then irradiated with an X-ray generated from a CuK$\alpha$ vessel to obtain an X-ray diffraction chart. According to the X-ray diffraction chart, the ratio $I_W$ (110)/$I_{Cu}$ (200) of the peak intensity height) $I_W$ (110) of the (110) plane of W to the peak intensity (height) $I_{Cu}$ (200) of the (200) plane of Cu was 121. A plurality of WC peaks appeared in this X-ray diffraction chart.

The substrate was cut to the size of 2 mm×1 mm×0.6 mm (lengthwise×breadthwise×thickness). However, the thin diamond film layer did not peel off the substrate. Then, the substrate was subjected to metallization to produce a heatsink. A laser diode was installed on the heatsink. This laser diode exhibited stable oscillation. It is therefore appreciated that this heatsink is sufficient for practical usage.

Example 9

In Example 3, the surface roughness $R_z$ of the W particle on the surface of the substrate was set to 0.09 $\mu$m by immersing the substrate in mixed acid. In Example 9, a method of roughening the surface of the W particle by a method other than that of the mixed acid process was studied. As a result, it was found that the surface of the W particle could be roughened by the following five methods.

1: Shot blasting of spraying fine particles such as of metal on the substrate
2: Argon sputtering of converting argon gas into plasma, and applying bias on the substrate to have argon atoms collide with the substrate
3: Alkali process of immersing the substrate in alkali
4: Fluorine plasma process of exposing the substrate to fluorine plasma
5: Electron beam irradiation of irradiating the substrate with an electron beam Example 10

A substrate of 13.5 mm×13.5 mm×0.6 mm (lengthwise×breadthwise×thickness) in size formed of a Cu—W sintered compact with the Cu content of 11% by weight was prepared. This substrate was immersed for 30 minutes in a solution of nitric acid diluted with pure water. Then, the surface of the substrate was irradiated with an X-ray to obtain an X-ray diffraction chart. No Cu peak was observed in this X-ray diffraction chart.

The surface of the substrate was subjected to a scratching process with diamond abrasive grains. Then, substrate 26 was placed on substrate holder 27 in hot filament CVD apparatus 1 shown in FIG. 1. Then, current was conducted from AC power supply 24 to tungsten filament 25, whereby the temperature of tungsten filament 25 was set to approximately 2050° C.

Then, mixture gas of methane and hydrogen with the methane concentration of 1 mole % was introduced into reactor 21 from gas inlet 22. A thin diamond film layer was grown on substrate 26 over 40 hours under the conditions that the pressure in reactor 21 was maintained at 70 Torr. The thin diamond film layer had a thickness of 24 $\mu$m. The warp of the substrate was 3 $\mu$m.

The thin diamond film layer was polished to have a mirror plane. Then the substrate was cut to the size of 2 mm×1 mm×0.6 mm (lengthwise×breadthwise×thickness). The thin diamond film layer did not peel off the substrate.

Then, the substrate was subjected to metallization to produce a heatsink. A laser diode was installed on the heatsink. This laser diode exhibited oscillation. It is therefore appreciated that this heatsink is sufficient for practical usage.

Example 11

A substrate of 10 mm×10 mm×0.6 mm (lengthwise×breadthwise×thickness) formed of a Cu—W sintered compact with the Cu content of 15% by weight was prepared. This substrate was immersed for three minutes in a solution of mixed acid (hydrofluoric acid and nitric acid mixed at the volume ratio of 1:1) with pure water. The surface roughness $R_Z$ of the substrate was 4.5 $\mu$m. The surface of the substrate subjected to acid treatment was observed with a 3D-SEM (three dimensional scanning electron microscope) of the ERA 8000 type from ELIONIX. The observed result is shown in FIG. 11.

Figure 11:
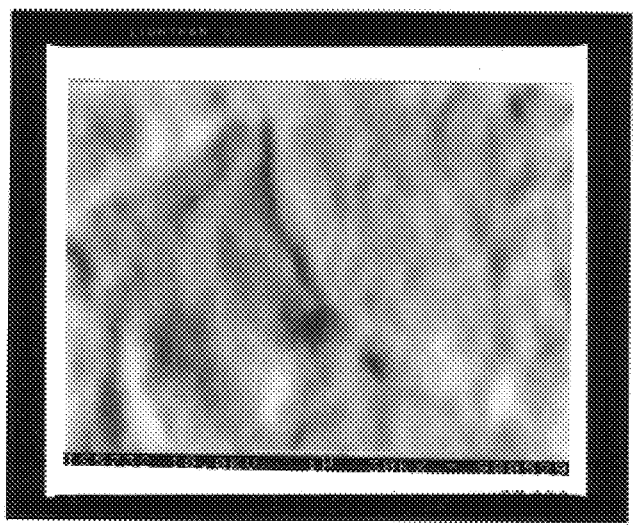
FIG. 11 is a scanning type electron microphotograph of a portion of a substrate subjected to acid treatment according to Example 11.

According to FIG. 11, W particles are exposed at the surface of the substrate subjected to acid treatment. The surface roughness of the exposed W particle was 0.08 $\mu$m.

Figure 12:
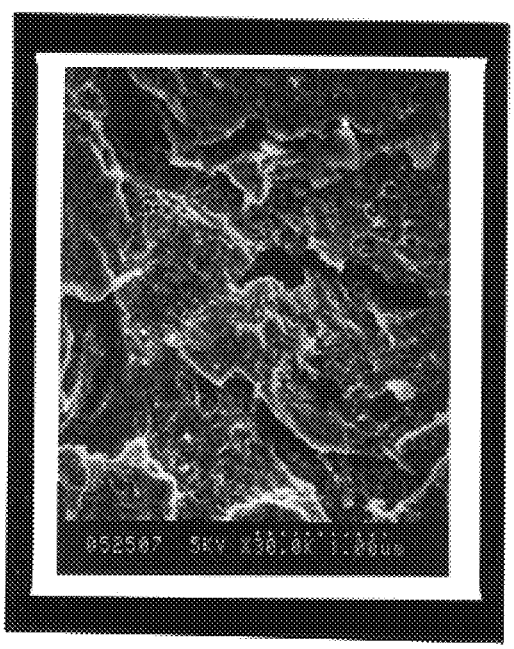
FIG. 12 is a scanning type electron microphotograph of another portion of a substrate subjected to acid treatment according to Example 11.

The surface of this substrate was observed by a FESEM (field emission scanning electron microscope). The observed result is shown in FIG. 12.

The surface of the substrate subjected to acid treatment was scratched with diamond grains. Then, substrate 26 was placed on substrate holder 27 in hot filament CVD apparatus 1 of FIG. 1.

The temperature of tungsten filament 25 was set to approximately 2100° C. Mixture gas of methane and hydrogen with the methane concentration of 1 mole % was introduced into reactor 21 through gas inlet 22. The pressure in reactor 21 was maintained at 70 Torr. A thin diamond film layer was grown on substrate 26 over 40 hours under the above conditions. The thin diamond film layer had a thickness of 22 $\mu$m. The warp of the substrate was 2.5 $\mu$m.

Then, the surface of the thin diamond film layer was polished to have a mirror plane. The substrate was cut to the size of 2 mm×1 mm×0.6 mm (lengthwise×breadthwise×thickness). However, the thin diamond film layer did not peel off the substrate.

Then, the surface of the substrate opposite to the surface where the thin diamond film layer is formed was polished and then subjected to metallization to produce a heatsink. A laser diode was placed on the heatsink. This laser diode exhibited stable oscillation. It is therefore appreciated that this heatsink is sufficient for practical usage.

Example 12

A substrate of 13.5 mm×13.5 mm×0.6 mm (lengthwise×breadthwise×thickness) formed of a Cu—W compact with the Cu content of 15% by weight was prepared. This substrate was immersed in a solution of hydrogen peroxide for one minute, then in nitric acid for five minutes. The surface roughness $R_Z$ of the substrate was 4.5 $\mu$m. The surface of the substrate was subjected to a scratching process by diamond grains. Substrate 26 was placed on substrate holder 27 in hot filament CVD apparatus 1 shown in FIG. 1.

The temperature of tungsten filament 25 was set to approximately 2100° C. Mixture gas of methane and hydrogen with the methane concentration of 1 mole % was introduced into reactor 21 through gas inlet 22. The pressure in reactor 21 was set to 70 Torr. A thin diamond film layer was grown on substrate 26 over 40 hours under the above conditions. The thin diamond film layer had a thickness of 21 $\mu$m. The warp of the substrate was 2.5 $\mu$m.

The surface of the thin diamond film layer was polished to have a mirror plane. The substrate was cut to the size of 2 mm×1 mm×0.6 mm (lengthwise×breadthwise×thickness). The thin diamond film layer did not peel off the substrate. Then, the surface of the substrate opposite to the surface where the thin diamond film layer is formed was polished and subjected to metallization to produce a heatsink. A laser diode was installed on this heatsink. This laser diode exhibited oscillation. It is therefore appreciated that this heatsink is sufficient for practical usage.

Example 13

A substrate of 15 mm×15 mm×1 mm (lengthwise×breadthwise×thickness) formed of a Cu—Mo sintered compact with the Cu content of 10% by weight was prepared. This substrate was immersed in sulfuric acid for thirty minutes. Accordingly, the porosity at the region of the substrate within 30 $\mu$m in depth from the surface of the substrate was 25% by volume, and the Cu content at the region of the substrate within 30 $\mu$m in depth from the surface was 2% by weight. It is to be noted that the entire Cu content of the substrate was still 10% by weight.

The surface of the substrate was subjected to a scratching process with diamond grains. Then, substrate 102 was placed on substrate holder 101 in microwave plasma CVD apparatus 100 shown in FIG. 4. The temperature of substrate 102 was set to approximately 850° C. Mixture gas of methane and hydrogen with the methane concentration of 3 mole % was introduced into reactor 107 through inlet 109. The pressure in reactor 107 was maintained at 140 Torr.

A thin diamond film layer was grown on substrate 102 over 20 hours under the above conditions. The thin diamond film layer had a thickness of 22 $\mu$m. The warp of the substrate was 4 $\mu$m.

The surface of the thin diamond film layer was polished to have a mirror plane. Then, the substrate was cut to the size of 2 mm×1 mm×1 mm (lengthwise×breadthwise×thickness). The thin diamond film layer did not peel off the substrate. Then, the surface of the substrate opposite to the surface where the thin diamond film layer is formed was polished and subjected to metallization to produce a heatsink. A laser diode was installed on this heatsink. This laser diode exhibited oscillation. It is therefore appreciated that this heatsink is sufficient for practical usage.

Example 14

A substrate of 10 mm×10 mm×0.3 mm (lengthwise× breadthwise×thickness) in size formed of a Cu—W sintered compact with the Cu content of 15% by weight was prepared. This substrate was immersed in hydrochloric acid for forty minutes. The surface roughness $R_z$ of the substrate resulted in 3.6 μm.

The surface of the substrate was subjected to a scratching process with diamond grains. Substrate 102 was placed on substrate holder 101 in the microwave plasma CVD apparatus shown in FIG. 7. The temperature of substrate 102 was set to approximately 850° C. Mixture gas of methane and hydrogen with the methane concentration of 3.5 mole % was introduced into reactor 107 through inlet 109. The pressure in reactor 107 was maintained at 140 Torr. A thin diamond film layer was grown on substrate 102 over 20 hours under the above conditions. The thickness of the thin diamond film layer was 25 μm. The warp of the substrate was 2.7 μm.

The surface of the thin diamond film layer was polished to have a mirror plane. Then, the substrate was cut to the size of 2 mm×1 mm×0.3 mm (lengthwise×breadthwise× thickness). The thin diamond film layer did not peel off the substrate. Then, the surface of the substrate opposite to the surface where the thin diamond film layer is formed was polished and subjected to metallization to form a heatsink. A laser diode was installed on this heatsink. This laser diode exhibited oscillation. It is therefore appreciated that this heatsink is sufficient for practical usage.

Example 15

A substrate of 10 mm×10 mm×0.6 mm (lengthwise× breadthwise×thickness) in size formed of a Cu—W sintered compact with the Cu content of 11% by weight was prepared. This substrate was immersed for one minute in a solution of mixed acid (mixture of hydrofluoric acid and nitric acid in the weight ratio of 1:1) diluted with pure water. Then, the substrate was immersed for five minute in nitric acid. The substrate was irradiated with an X-ray generated from a CuKα vessel to obtain an X-ray diffraction chart. This X-ray diffraction chart is shown in FIG. 13.

Figure 13:
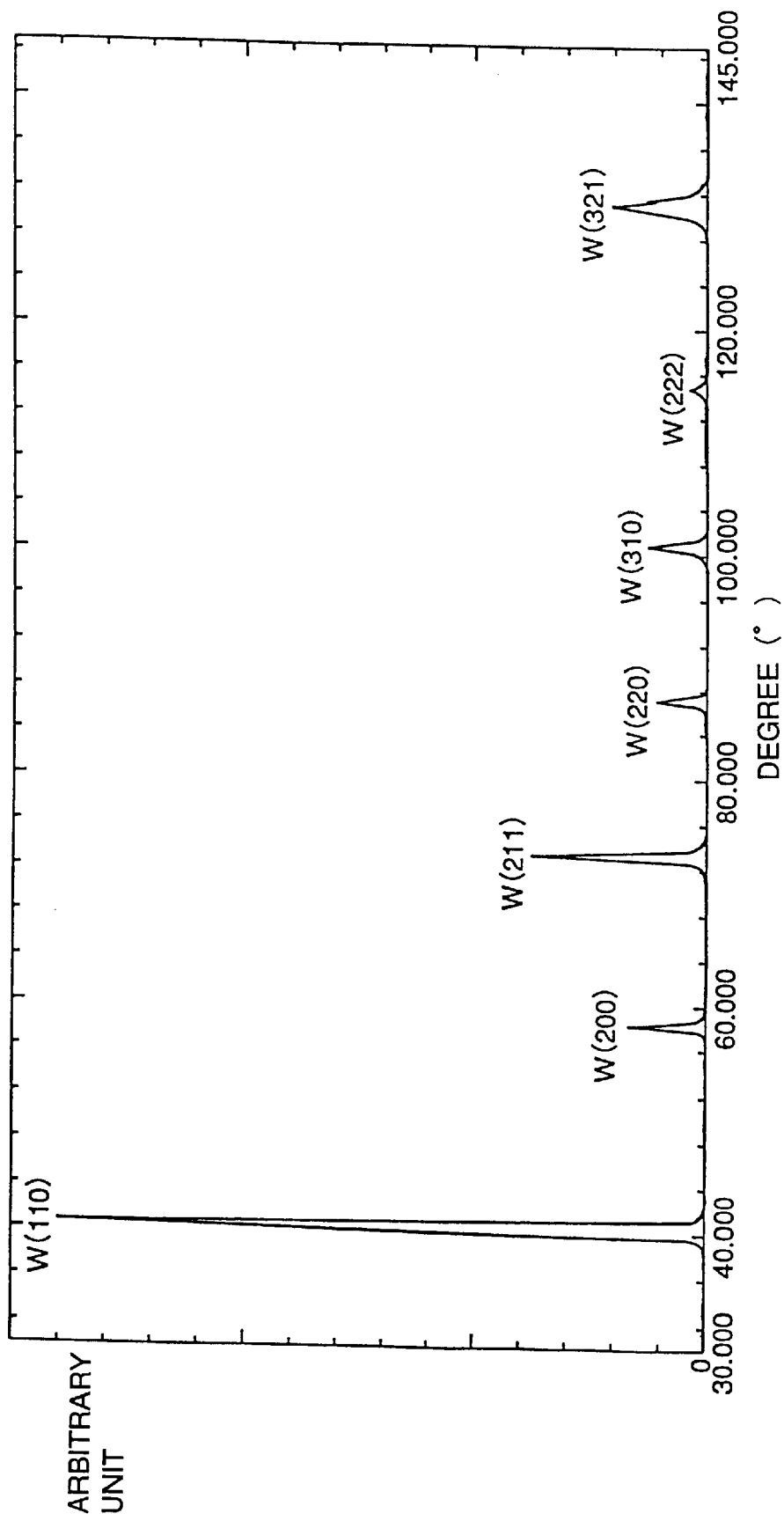
FIG. 13 is an X-ray diffraction chart of a substrate subsequent to acid treatment according to Example 15.

It is appreciated from FIG. 13 that no Cu peak appears in the X-ray diffraction chart of the surface of the substrate subjected to acid treatment.

Then, the surface of this substrate is subjected to a scratching process using diamond grains. Then, substrate 26 was placed on substrate holder 27 in hot filament CVD apparatus 1 shown in FIG. 1. Then, temperature of tungsten filament 25 was set to approximately 2100° C. Mixture gas of methane and hydrogen with the methane concentration of 1 mole % was introduced into reactor 21 through gas inlet 22. The pressure of reactor 21 was set to 70 Torr. A thin diamond film layer was formed on substrate 26 over 40 hours under the above conditions. The thickness of the thin diamond film layer was 20 μm. The warp of the substrate was 2.5 μm.

The surface of the thin diamond film layer was polished to have a mirror plane. Then the substrate was cut to the size of 2 mm×1 mm×0.6 mm (lengthwise×breadthwise× thickness). The thin diamond film layer did not peel off the substrate. Then, the surface of the substrate opposite to the surface where the thin diamond film layer is formed was polished so that the thickness of the substrate was 0.3 mm. This substrate was subjected to metallization to produce a heatsink. A laser diode was installed on the heatsink. This laser diode exhibited oscillation. It is therefore appreciated that this heatsink is sufficient for practical usage.

Comparative Example 3

In Comparative Example 3, the condition of the acid treatment of Example 15 was altered. In contrast to Example 15 in which the substrate was immersed for one minute in mixed acid diluted with pure water and then immersed for five minutes in nitric acid, Comparative Example 3 had the substrate immersed for ten seconds in mixed acid diluted with pure water, but was not immersed in nitric acid thereafter. A thin diamond film layer was grown on the substrate subjected to acid treatment under the conditions similar to those of Example 15. This thin diamond film layer was irradiated with an X-ray generated from a CuKα vessel to obtain an X-ray diffraction chart. This X-ray diffraction chart is shown in FIG. 14.

Figure 14:
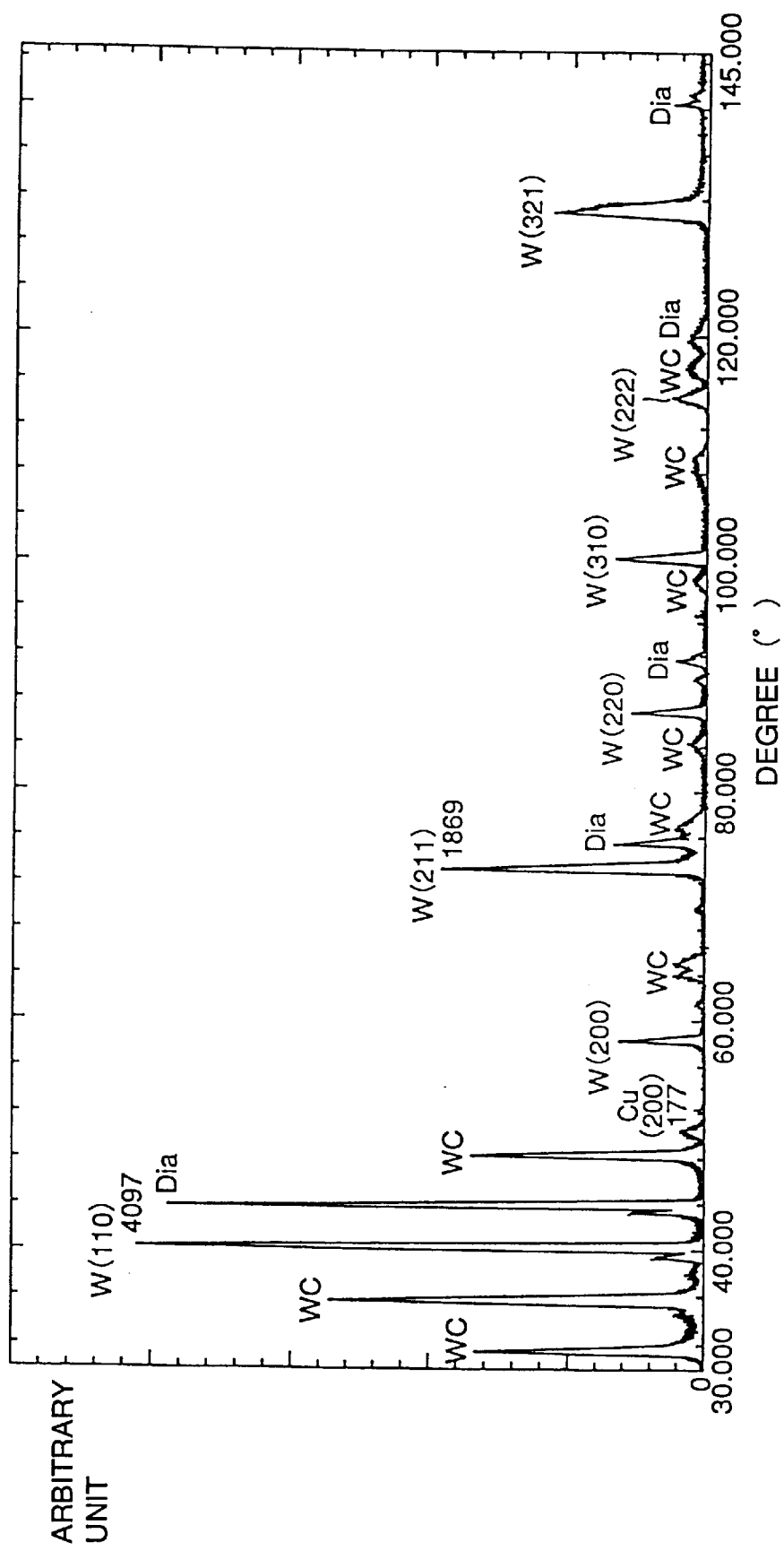
FIG. 14 is an X-ray diffraction chart of a substrate subsequent to acid treatment according to Comparative Example 3.

It is appreciated that there is a Cu peak in the X-ray diffraction chart of FIG. 14. The surface of the diamond was polished to have a mirror plane. Then the substrate was cut to the size of 2 mm×1 mm×0.6 mm (lengthwise× breadthwise×thickness). A portion of the thin diamond film layer peeled off the substrate.

Example 16

Figure 18:
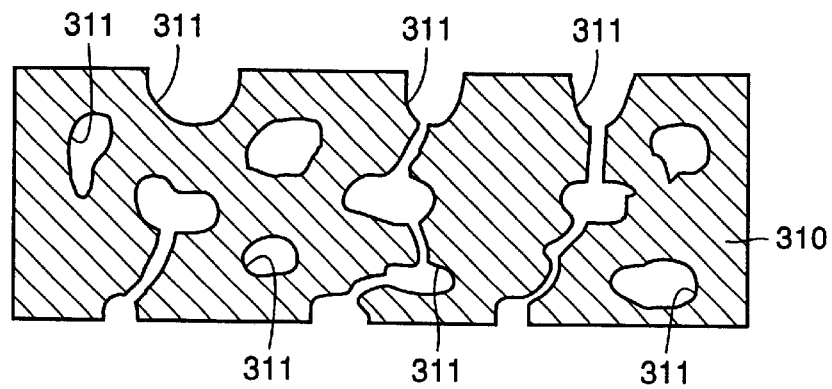
FIGS. 18, 19 and 20 are schematic diagrams showing the first, second, and third steps, respectively, of a heatsink fabricating method of the present invention.

A porous body 310 as shown in FIG. 18 in the size of 100 mm×80 mm×1 mm (lengthwise×breadthwise×thickness), formed of a tungsten metal sintered compact with the porosity of 21% by volume was prepared. The surface of porous body 310 including a hole 311 was subjected to a scratching process with diamond grains. Then, porous body 310 was mounted on substrate holder 27. Then, current was conducted from AC power supply 24 to tungsten filament 25, whereby the temperature of tungsten filament 25 was set to approximately 2050° C.

Figure 19:
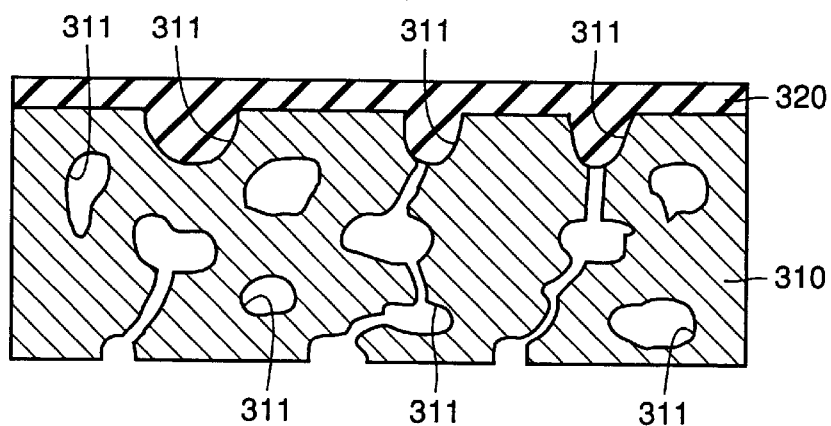

Then, mixture gas of hydrogen and methane with the methane concentration of 1 mole % was introduced into reactor 21 through gas inlet 22. A thin diamond film layer 320 as shown in FIG. 19 was grown on porous body 310 over 40 hours under the condition that the pressure in reactor 21 was maintained at 70 Torr. The thickness of thin diamond film layer 320 was 24 μm. Then, a Cu plate was mounted on a heater for heating. Porous body 310 on which thin diamond film layer 320 is formed was mounted on this Cu plate.

The Cu was heated using the heater up to the temperature of 1100° C. to be melted, whereby the Cu permeated into hole 311 of porous body 310 over the period of ten hours to form a substrate. The substrate includes the porous body and Cu. Then, the substrate was cut to the size of 10 mm×10 mm×1 mm (lengthwise×breadthwise×thickness). The thin diamond film layer was polished to have a mirror plane. The substrate was cut to the size of 2 mm×1 mm×1 mm (lengthwise×breadthwise×thickness) to obtain a heatsink. The thin diamond film layer did not peel off the porous body. The thin diamond film layer and the substrate were subjected to metallization to obtain a heatsink shown in FIG. 20.

Figure 20:
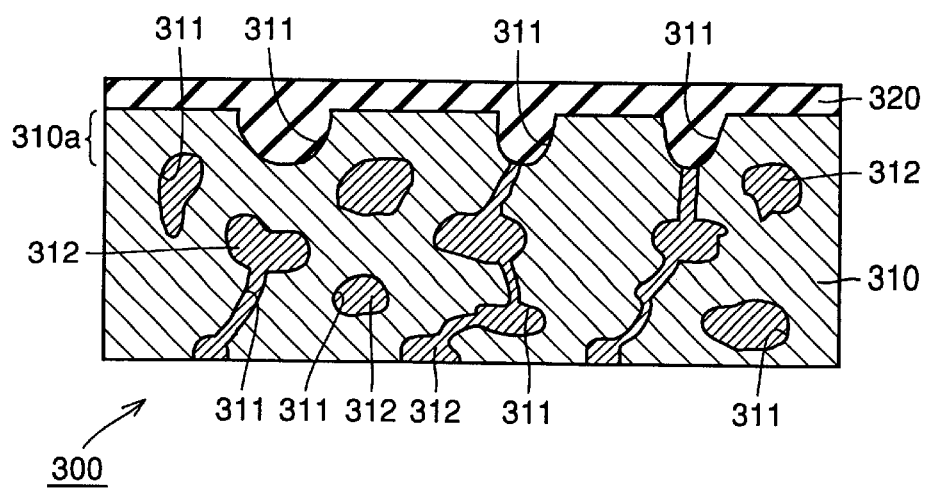

Referring to FIG. 20, a heatsink 300 is formed of porous body 310 and thin diamond film layer 320. Porous body 310 is formed of a tungsten metal sintered compact which is a sintered version of fine tungsten metal powder. A plurality of holes 311 are present in porous body 310. All these holes 311 communicate with each other. Holes 311 are filled with Cu 312. At the surface layer 310a of the porous body, diamond film layer 320 permeates into hole 311.

A polycrystalline diamond film layer 320 is formed at the surface of porous body 310.

A laser diode was installed on this heatsink 300. This laser diode exhibited oscillation. It is therefore appreciated that this heatsink is sufficient for actual practice.

Example 17

A porous body of 100 mm×80 mm×2 mm (lengthwise× breadthwise×thickness) in size, formed of a porous tungsten metal sintered compact with the porosity of 28% by volume was prepared. The surface of porous body was subjected to a scratching process with diamond grains. Then, the porous body was mounted on substrate holder 27 shown in FIG. 1. The temperature of tungsten filament 25 was set to approximately 2100° C. Mixture gas of hydrogen and methane with the methane concentration of 1 mole % was introduced into reactor 21 through gas inlet 22. The pressure in reactor 21 was set to 70 Torr. A thin diamond film layer was formed on the porous body over 40 hours under the above conditions. The thickness of the thin diamond film layer was 22 μm.

Then, the porous body was placed on substrate holder 27 with the thin diamond film layer downwards. A Cu plate was placed on the porous body. A heater was placed on this Cu plate to heat the Cu plate up to the temperature of 1100° C to melt the Cu. Accordingly, the Cu permeated into the porous body to form a substrate. The substrate includes the porous body and Cu. Then, the substrate was cut to the size of 10 mm×10 mm×2 mm (lengthwise×breadthwise× thickness). The thin diamond film layer had its surface polished to have a mirror plane. Then, the substrate was cut to the size of 2 mm×1 mm×1 mm (lengthwise×breadthwise× thickness). However, the thin diamond film layer did not peel off the substrate.

The plane of the substrate opposite to the plane where the thin diamond film layer is formed was polished and subjected to metallization to produce a heatsink. A laser diode was installed on this heatsink. This laser diode exhibited oscillation. It is therefore appreciated that this heatsink is applicable to practice usage.

Example 18

A porous body of 100 mm×80 mm×2 mm in size (lengthwise×breadthwise×thickness) formed of a porous tungsten metal sintered compact with the porosity of 35% by volume was prepared. The surface of the porous body was subjected to a scratching process with diamond grains. This porous body was placed on substrate holder 27 shown in FIG. 1. The temperature of tungsten filament 25 was set to approximately 2100° C. Mixture gas of hydrogen and methane with the methane concentration of 1 mole % was introduced into reactor 21 through gas inlet 22. The pressure of reactor 21 was set to 70 Torr. A thin diamond film layer was grown on porous body over 40 hours under the above conditions. The thickness of the thin diamond film layer was 22 μm.

Then, a crucible was prepared as a container. Cu was introduced into this crucible. The Cu was heated up to the temperature of 1100° C. to be melted. The porous body was dipped in the crucible to have the Cu permeate into the hole of the porous body to form a substrate. The substrate includes the porous body and Cu. Then, the substrate was cut to the size of 10 mm×10 mm×2 mm (lengthwise× breadthwise×thickness). The surface of the thin diamond film layer was polished to have a mirror plane. Then, the substrate was further cut to the size of 2 mm×1 mm×1 mm (lengthwise×breadthwise×thickness). The plane of the substrate opposite to the plane where the thin diamond film layer is formed was polished and subjected to metallization to produce a heatsink. A laser diode was installed on this heatsink. This laser diode exhibited oscillation. It is therefore appreciated that this heatsink is applicable to practice usage.

Example 19

Figure 21:
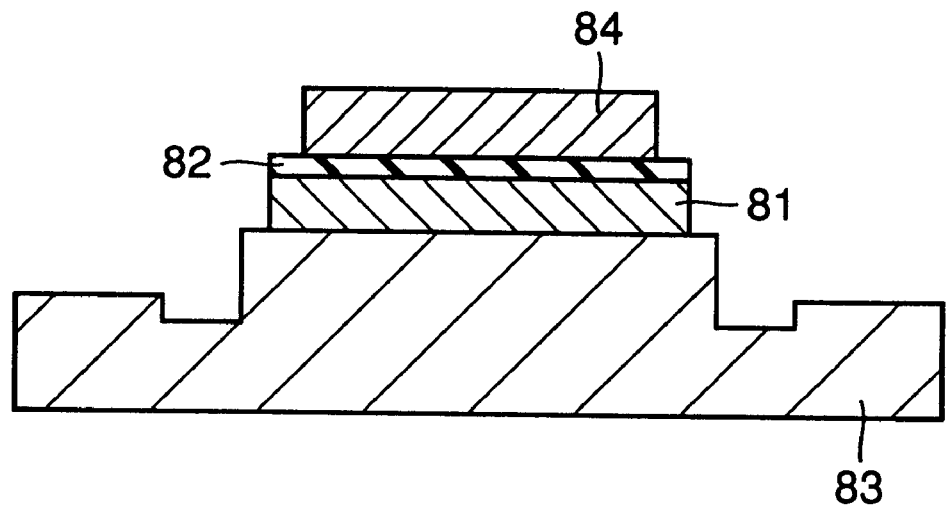
FIG. 21 is a sectional view schematically showing a semiconductor module according to Example 19 of the present invention.

A radiator base 81 of 20 mm×20 mm×0.4 mm (lengthwise×breadthwise×thickness) formed of Si, AlN, CuW alloy or SiC as shown in FIG. 21 was prepared. One surface thereof was subjected to a scratching process using diamond powder. Then, diamond was grown entirely on that surface by hot filament CVD. The conditions for growth is set forth in the following.

| Material gas | 1% by weight methane-hydrogen |
|---|---|
| Flow rate | 600 sccm |
| Pressure | 80 Torr |
| Substrate Temperature | 710° C. |
| Filament | Tungsten |
| Filament Temperature | 2150° C. |

At one surface of each radiator base 81, a vapor synthesis diamond layer 82 of high adherence was obtained. Each vapor synthesis diamond layer 82 was polished to have respective thickness of 20 μm, 50 μm, and 100 m. The thermal conductivity of each obtained vapor synthesis diamond layer 82 was measured by the laser flash method. Each vapor synthesis diamond layer 82 had the thermal conductivity of 1310 W/m·K.

Following the polishing process, each vapor synthesis diamond layer 82 was cut by laser and had its surface subjected to metallization. All the metallized layers were Au 3 μm/Pt 0.05 μm/Ti 0.1 μm. The opposite surface of radiator base 81 was metallized by depositing Au, and bound to a base metal member 83 formed of a CuW alloy with a brazing material. An MMIC formed of GaAs which is a semiconductor element 84 is bound using a brazing material to the metallized layer on vapor synthesis diamond layer 82 with the heat generating region above.

As a comparative example, a diamond free-standing plate (20 mm×20 mm×0.4 mm: (lengthwise×breadthwise× thickness) and a BeO substrate (20 mm×20 mm×0.4 mm: (lengthwise×breadthwise×thickness) were prepared instead of the heatsink formed of a layered member of the above vapor synthesis diamond layer 82 and radiator base 81. In a similar manner, the base metal member and the semiconductor element (MMIC) were bound.

Sample 13 using the diamond free-standing plate was cracked when the semiconductor element of GaAs was mounted. In contrast, respective samples 1–12 of the present invention exhibited no breakage of the semiconductor element at the time of mounting by brazing. This is because the thermal expansion coefficient of samples 1–12 of the present invention is similar to that of GaAs. The mounted semiconductor element, i.e., MMIC, operated stably. Samples 1–12 and 14 that did not exhibit breakage of the semiconductor element have low thermal resistance, as indicating in the following Table 1. Particularly, the thermal resistance of samples 1–12 of the present invention was lower than that of sample 14 using BeO.

TABLE 1

| Sample | Heatsink Structure | Diamond Thickness (μm) | Thermal Resistance (° C./W) |
|---|---|---|---|
| 1 | Diamond/Si | 20 | 3.71 |
| 2 | Diamond/Si | 50 | 3.51 |
| 3 | Diamond/Si | 100 | 3.27 |
| 4 | Diamond/AlN | 20 | 3.59 |
| 5 | Diamond/AlN | 50 | 3.38 |
| 6 | Diamond/AlN | 100 | 3.10 |
| 7 | Diamond/CuW | 20 | 3.52 |
| 8 | Diamond/CuW | 50 | 3.30 |
| 9 | Diamond/CuW | 100 | 2.99 |
| 10 | Diamond/SiC | 20 | 3.85 |
| 11 | Diamond/SiC | 50 | 3.65 |
| 12 | Diamond/SiC | 100 | 3.34 |
| 13* | Diamond Free-standing plate | 400 | — |
| 14* | BeO Substrate | — | 4.35 |

(Note) Sample with * in table indicates comparative example

Example 20

Figure 22:
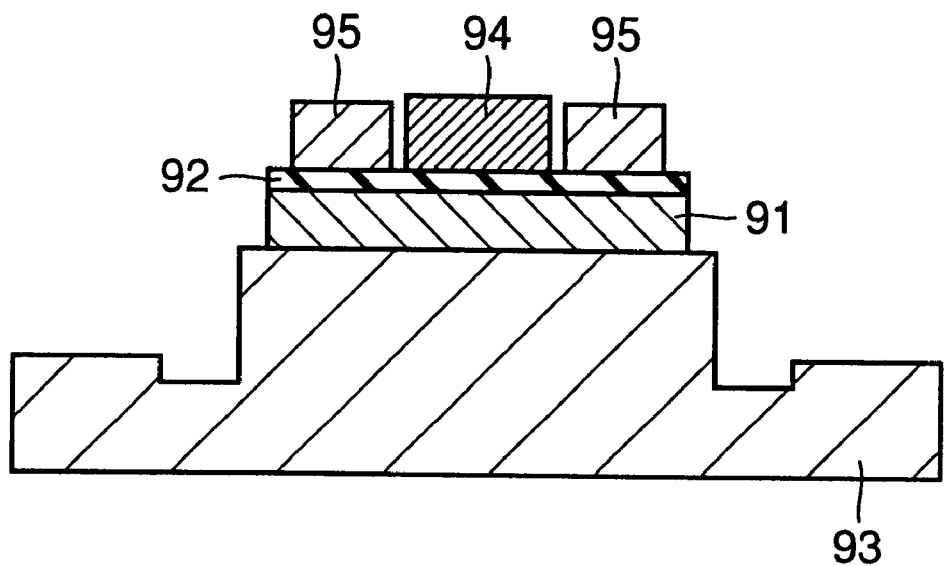
FIG. 22 is a sectional view schematically showing a semiconductor module according to Example 20 of the present invention.

In the manner similar to that of the above Example 19, a thin diamond film layer was grown by vapor synthesis on one surface of a radiator base 91 of 14 mm×14 mm×0.4 mm (lengthwise×breadthwise×thickness) in size as shown in FIG. 22. This thin diamond film layer was polished. A heatsink was produced having vapor synthesis diamond layer 92 of 40 μm in thickness on radiator base 91.

A polyimide-Cu multilayer interconnection layer (three layers) 95 was provided on vapor synthesis diamond layer 92 of the heatsink. Then, excimer laser was focused on a predetermined position to carry out via hole processing to form an interlayer interconnection by the through hole. Then, similar to Example 19, the radiator base 91 side of the heatsink was attached by brazing to metal member 93 based on CuW. MMIC semiconductor element 94 was bound by brazing at the element mounting area of vapor synthesis diamond layer 92. Then, connection between semiconductor element 94 and multilayer interconnection layer 95 was effected.

MMIC semiconductor element 94 mounted on this heatsink did not exhibit breakage during the stage of mounting. Semiconductor element 94 operated stably for a long period of time. Superior heat dissipation was exhibited.

The following issues are identified from the above Examples 19 and 20. In order to prevent the semiconductor element from cracking, the semiconductor module of the present invention includes a radiator base of 200–700 μm in thickness with the thermal conductivity of at least 100 W/m·K, a vapor synthesis diamond layer of 10–200 μm in thickness provided on the radiator base, and a high power semiconductor element mounted on the vapor synthesis diamond layer.

In the semiconductor module of the present invention, the radiator base is formed of at least one type selected from the group consisting of Si, SiC, AlN, CuW alloy, CuMo alloy, and CuMoW alloy. The base may have the Cu concentration become lower as a function of approaching the surface, as used in Examples 1–18, or may have Cu permeated into the hole of a W porous body. The vapor synthesis diamond layer has a thermal conductivity that is preferably at least 1000 W/m·K.

As a specific structure related to mounting a semiconductor element for the semiconductor module of the present invention, at least a portion of the semiconductor element mounting surface of the vapor synthesis diamond layer has a metallized layer, wherein the metallized layer is formed of at least one type selected from the group of Au, Mo, Ni, Pt, Pd, Ti, Cu, Al, and has a high power semiconductor element bound on the metallized layer by a brazing material.

In the semiconductor module of the present invention, the mounted high power semiconductor element has gallium arsenide as the main component. The semiconductor module of the present invention is particularly suitable for mounting a high power transistor and a MMIC. The high power semiconductor element preferably has its plane opposite to the heat generating region bound to the vapor synthesis diamond layer side. density of the semiconductor element can be further improved by forming a multilayer interconnection layer including an insulation layer having a dielectric constant of not more than 5 and a metal interconnection layer at the plane side of the vapor synthesis diamond layer where the high power semiconductor element is mounted.

In the semiconductor module of the present invention, a thin vapor synthesis diamond layer of 10–200 μm in thickness is arranged at the plane side where the semiconductor element of the radiator base serving as a heatsink or a radiator base is mounted. By arranging such a thin vapor synthesis diamond layer on the radiator base, the heat generated from the semiconductor element mounted on this vapor synthesis diamond layer can be dissipated efficiently. Also, the semiconductor element can be prevented from being cracked at the time of mounting.

The heat generated by the semiconductor element is first diffused laterally within the vapor synthesis diamond layer of high thermal conductivity to be further diffused towards the radiator base from the entire surface of the vapor synthesis diamond layer. Therefore, heat dissipation of high efficiency can be applied to the module even if the vapor synthesis diamond layer is thin. The thermal conductivity of the vapor synthesis diamond layer is preferably at least 100 W/m·K in order to achieve favorable heat dissipation in the horizontal direction in the vapor synthesis diamond layer.

Although the heat conductivity of the radiator base may be smaller than the heat conductivity of diamond, the heat dissipation effect of the vapor synthesis diamond layer will be lost if the thermal conductivity is too low. Therefore, the thermal conductivity of the radiator base must be at least 1000 W/m·K. As a radiator base with such thermal conductivity, Si, SiC, AlN, Cu, CuW alloy, CuMo alloy, CuMoW alloy and the like is preferably used.

In general, diamond is degraded in mechanical strength as it becomes thinner, and has a low thermal expansion coefficient. There was a problem that the semiconductor element is cracked due to difference in thermal expansion when a semiconductor element formed mainly of gallium arsenide (GaAs) such as a MMIC. is connected by brazing.

However, the present invention provides a thin coat of diamond that is less than 200 μm in thickness by vapor synthesis on a radiator base that has a thermal expansion coefficient higher than that of diamond. Accordingly, the obtained vapor synthesis diamond layer has a thermal expansion coefficient approaching that of the radiator base without having the mechanical strength degraded. Therefore, cracking of the semiconductor element can be suppressed even when a semiconductor element of GaAs is brazed on the vapor synthesis diamond layer.

When the thickness is at least 10 μm, the vapor synthesis diamond layer has sufficient mechanical strength and exhibits sufficient heat dissipation. Preferably, the thickness of the vapor synthesis diamond layer is at least 20 μm. However, the cost will increase as the vapor synthesis diamond layer becomes thicker. If the vapor synthesis diamond layer becomes thicker than 200 μm, the influence of the underlying radiator base will be lost, to degrade the thermal expansion coefficient. As a result, the possibility of breakage in the semiconductor element when mounted becomes higher. If the thickness of the radiator base is less than 200 μm, the mechanical strength will become too weak. If the thickness of the radiator base exceeds 700 μm, the entire heat dissipation of the module will be degraded. Therefore, the thickness of the radiator base is preferably in the range of 200–700 μm, more preferably in the range of 250–500 μm.

Natural diamond or high pressure synthetic diamond can be used for the diamond layer provided on the radiator base. However, it is difficult to bond the diamond layer and the base together. Degradation in heat dissipation will occur. There was a problem that a diamond layer of a large area cannot be produced. According to the vapor synthesis method, a thin diamond film layer can be directly grown on the radiator base. According to the present invention, a vapor synthesis diamond layer with the required heat conductance and thickness can be obtained easily. Furthermore, the cost can be reduced considerably in comparison to the case using natural diamond or high pressure synthetic diamond.

The layered member of the vapor synthesis diamond layer and the radiator base is used as the heatsink or the radiator substrate. A high power semiconductor element such as a high power transistor or a MMIC is mounted on the vapor synthesis diamond layer. These high power semiconductor elements have GaAs as the main component. The semiconductor element generally has a heat generation region at one surface side. The semiconductor element can be mounted with the surface opposite to the side of this heat generation region facing the vapor synthesis diamond layer mounted.

In order to mount a semiconductor element, a metallized layer is formed of at least one type selected from the group consisting of Au, Mo, Ni, Pt, Pd, Ti, Cu, Al, and the like for the semiconductor element mounting plane of the vapor synthesis diamond layer. A high power semiconductor element such as a high power transistor or a MMIC is fixed on the metallized layer by a brazing material such as AuSn, AuGe, and AuSi. The total thickness of these metallized layer and brazing layer is preferably in the range of 0.1–50 μm.

The packaging density of the semiconductor element can further be improved by interconnection with the semiconductor element according to a multilayer interconnection layer of an insulation layer and a metal interconnection layer formed at the plane of the vapor synthesis diamond layer where the semiconductor element is mounted. In this case, the insulation layer preferably has a dielectric constant of not more than 5 since an insulation of lower dielectric constant can have the noise by propagation or the loss reduced.

The layered member of the above vapor synthesis diamond layer and radiator base is connected to the general base metal such as CuW at the radiator base side to be used as a heatsink or a radiator substrate. In this case, a metallized layer formed of at least one type selected from the group consisting of Au, Mo, Ni, Pt, Pd, Ti, Cu, Al, and the like is provided at the surface side of the radiator base where the base metal is connected. The metallized layer is bound using a brazing material such as AuSn and AuSi.

According to the present invention, a heatsink can be provided improved in adherence between the thin diamond film layer and the substrate, with the warping reduced.

The present invention is advantageous in that the fabrication is carried out without using toxic BeO. Since a thin vapor synthesis diamond layer is used, the cost can be suppressed. A semiconductor module superior in heat dissipation can be provided. The semiconductor module has difference in thermal expansion with the semiconductor element reduced by the radiator base and the vapor synthesis diamond layer formed thereon to alleviate thermal stress in the element. Therefore, cracking in the semiconductor element can be suppressed during the element mounting stage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heatsink comprising:
   a substrate of a sintered compact including Cu and W, and
   a thin diamond film layer formed on a surface of said substrate,
   wherein said substrate has a content of said Cu being at least 5% by weight, and
   wherein said heatsink exhibits a diffraction peak intensity of a (110) plane of W being at least 100 times a diffraction peak intensity of a (200) plane of Cu in an X-ray diffraction chart obtained by irradiating said thin diamond film layer with an X-ray.

2. The heatsink according to claim 1, wherein a WC peak appears in said X-ray diffraction chart obtained by irradiating the thin diamond film layer with an X-ray.

3. A heatsink comprising:
   a substrate of a sintered compact including Cu and W, and
   a thin diamond film layer formed on a surface of said substrate,
   wherein said substrate has a content of said Cu being at least 5% by weight, and
   wherein said heatsink exhibits a diffraction peak intensity of a (211) plane of W being at least 30 times a diffraction peak intensity of a (200) plane of Cu in an X-ray diffraction chart obtained by irradiating said thin diamond film layer with an X-ray.

4. The heatsink according to claim 3, wherein a WC peak appears in said X-ray diffraction chart obtained by irradiating the thin diamond film layer with an X-ray.

5. A heatsink comprising:
   a substrate including Cu and a metal of a low thermal expansion coefficient, and
   a thin diamond film layer formed on a surface of said substrate,
   wherein said substrate has a content of said Cu being at least 5% by weight, and
   wherein said Cu content in said substrate becomes smaller as a function of approaching said surface of said substrate.

6. The heatsink according to claim 5, wherein said Cu content of a portion of said substrate not more than 10 μm in depth from said surface of said substrate is not more than 50% of the entire Cu content of said substrate.

7. The heatsink according to claim 5, wherein said substrate is a Cu—W sintered compact or a Cu—W—Mo sintered compact.

8. The heatsink according to claim 5, wherein said substrate includes W particles that are exposed at said surface of said substrate, and wherein said W particles have a surface roughness $R_z$ of at least 0.05 μm.

9. The heatsink according to claim 5, further comprising an intermediate layer of approximately 0% by weight in Cu content formed between said surface of said substrate and said thin diamond film layer.

10. The heatsink according to claim 5, wherein said substrate has a thickness of at least 200 μm and not more than 10000 μm.

11. The heatsink according to claim 5, wherein said thin diamond film layer has a thickness of at least 10 μm.

12. The heatsink according to claim 5, wherein said substrate has a heat conductivity of at least 100 W/m·K, and a thickness of at least 200 μm and not more than 700 μm, and said thin diamond film layer has a thickness of at least 10 μm and not more than 200 μm.

13. The heatsink according to claim 12, wherein said thin diamond film layer has a heat conductivity of at least 1000 W/m·K.

14. A method of fabricating the heatsink of claim 5, comprising the steps of:

immersing a surface of a substrate including Cu and a metal of a low thermal expansion coefficient in acid to reduce a Cu content of a region of a surface layer of said substrate, and roughening an exposed surface of said metal of a low thermal expansion coefficient at said surface, and forming a thin diamond film layer by vapor synthesis on said surface of said substrate subjected to said acid treatment.

15. The heatsink fabrication method according to claim 14, wherein said acid is a solution selected from the group consisting of hydrochloric acid, nitric acid, sulfuric acid, hydrofluoric acid, hydrogen peroxide, chromic acid, or a solution of a mixture thereof.

16. The heatsink fabrication method according to claim 14, wherein said step of reducing said Cu content of said region of said surface layer of said substrate includes a first acid treatment step of immersing said surface of said substrate in a first acid, and a subsequent second acid treatment step of immersing said substrate in a second acid different from said first acid.

17. The heatsink fabrication method according to claim 14, wherein said substrate comprises a sintered compact selected from the group consisting of a Cu—W sintered compact and a Cu—W—Mo sintered compact.

18. The heatsink fabrication method according to claim 14, wherein said substrate includes W particles that are exposed at said surface of said substrate that has been immersed in acid, and wherein said W particles have a surface roughness $R_z$ of at least 0.05 μm.

19. The heatsink fabrication method according to claim 14, wherein said reducing of said Cu content is carried out until a Cu peak is not detected in an X-ray diffraction chart obtained by irradiating said surface of said substrate with an X-ray.

20. The heatsink fabrication method according to claim 14, wherein said reducing of said Cu content is carried out until a region within 30 μm in depth from said surface of said substrate has a porosity of at least 5% by volume and not more than 70% by volume, and has a Cu content that is not more than 50% of the entire Cu content of said substrate.

21. The heatsink fabrication method according to claim 14, further comprising a step of carrying out a scratching process on said surface of said substrate using diamond, prior to formation of said thin diamond film layer.

22. A heatsink comprising a substrate, and a thin diamond film layer formed on said substrate, said substrate including:
a porous body with a low thermal expansion coefficient and with a hole therein, and
Cu filling said hole in said porous body,
wherein said thin diamond film layer is permeating into said hole at a surface layer of said porous body.

23. The heatsink according to claim 22, wherein said substrate has a thermal conductivity of at least 100 W/m·K and a thickness of at least 200 μm and not more than 700 μm, and said thin diamond film layer has a thickness of at least 10 μm and not more than 200 μm.

24. The heatsink according to claim 23, wherein said thin diamond film layer has a thermal conductivity of at least 1000 W/m·K.

25. A method of fabricating the heatsink of claim 22, comprising the steps of:

forming a thin diamond film layer on a surface of a porous body having a low thermal expansion coefficient, and filling a hole in said porous body with Cu after formation of said thin diamond film layer.

26. The heatsink fabrication method according to claim 25, wherein said porous body comprises a sintered compact selected from the group consisting of a W sintered compact and a W—Mo sintered compact.

27. The heatsink fabrication method according to claim 25, wherein said porous body has porosity of at least 15% by volume and not more than 60% by volume.

28. The heatsink fabrication method according to claim 25, wherein said step of filling said hole in said porous body with Cu includes a step of permeating molten Cu into said hole in said porous body.

29. The heatsink fabrication method according to claim 25, wherein said step of filling said hole in said porous body with Cu includes a step of heating and melting Cu to permeate molten Cu into said hole after placing said porous body on solid Cu.

30. The heatsink fabrication method according to claim 25, wherein said step of filling said hole in said porous body with Cu includes a step of heating and melting Cu to permeate molten Cu into said hole after placing solid Cu on said porous body where said thin diamond film layer is formed.

31. The heatsink fabrication method according to claim 25, wherein said step of filling said hole in said porous body with Cu includes a step of storing molten Cu in a container, and permeating said molten Cu into said hole by immersing a portion of said porous body, where said thin diamond film layer is formed, into said molten Cu in said container.

32. The heatsink fabrication method according to claim 25, further comprising a step of scratching said surface of said porous body using diamond, prior to formation of said thin diamond film layer.

* * * * *

UNITED STATES PATENT AND TRADEMARK OFFICE
CERTIFICATE OF CORRECTION

PATENT NO. : 6,361,857 B1
DATED : March 26, 2002
INVENTOR(S) : Saito et al.

It is certified that error appears in the above-identified patent and that said Letters Patent is hereby corrected as shown below:

<u>Title page,</u>
Item [30], Foreign Application Priority Data, insert the following:

-- Jul. 31, 1998 (JP) ………………….. 10-230194 --

<u>Column 4,</u>
Line 56, after "least", replace "100 W/m·K" by -- 1000 W/m·K --.

<u>Column 6,</u>
Line 44, before "W/m·K" replace "10" by -- 100 --.

<u>Column 22,</u>
Line 31, after "and", replace "100 m" by -- 100 μm --.

<u>Column 24,</u>
Line 12, after "side.", insert -- In the semiconductor module of the present invention, the packaging --.

Signed and Sealed this

First Day of October, 2002

*Attest:*

*Attesting Officer*

JAMES E. ROGAN
*Director of the United States Patent and Trademark Office*